US008975751B2

(12) United States Patent
Mohammed et al.

(10) Patent No.: US 8,975,751 B2
(45) Date of Patent: Mar. 10, 2015

(54) VIAS IN POROUS SUBSTRATES

(75) Inventors: Ilyas Mohammed, Santa Clara, CA (US); Belgacem Haba, Saratoga, CA (US); Cyprian Uzoh, San Jose, CA (US); Piyush Savalia, Santa Clara, CA (US)

(73) Assignee: Tessera, Inc., San Jose, CA (US)

( * ) Notice: Subject to any disclaimer, the term of this patent is extended or adjusted under 35 U.S.C. 154(b) by 56 days.

(21) Appl. No.: 13/092,495

(22) Filed: Apr. 22, 2011

(65) Prior Publication Data
US 2012/0267789 A1 Oct. 25, 2012

(51) Int. Cl.
*H01L 23/52* (2006.01)
*H01L 21/768* (2006.01)
*H01L 21/48* (2006.01)
*H01L 23/14* (2006.01)
(Continued)

(52) U.S. Cl.
CPC ........ *H01L 21/76898* (2013.01); *H01L 21/486* (2013.01); *H01L 23/147* (2013.01); *H01L 23/15* (2013.01); *H01L 23/481* (2013.01); *H01L 23/49827* (2013.01); *H01L 2924/09701* (2013.01); *H01L 2924/0002* (2013.01)
USPC .... 257/774; 257/773; 257/734; 257/E23.011; 257/E23.067; 257/E23.145

(58) Field of Classification Search
CPC ................ H01L 23/5384; H01L 2225/06541; H01L 2225/06548; H01L 21/6898; H01L 21/486; H01L 23/147; H01L 23/15; H01L 2024/09701; H01L 2924/0002
USPC .................. 257/773, 774, E23.011, E23.067, 257/E23.145, E21.577, E21.578, 734
See application file for complete search history.

(56) References Cited

U.S. PATENT DOCUMENTS 6,544,832 B2 * 4/2003 Kotecki et al. ................ 438/239
7,276,799 B2 * 10/2007 Lee et al. ...................... 257/777
(Continued)

FOREIGN PATENT DOCUMENTS

EP 0666595 A1 8/1995

OTHER PUBLICATIONS

International Search Report and Written Opinion for Application No. PCT/US2012/034038 dated Sep. 26, 2012.
(Continued)

*Primary Examiner* — Galina Yushina
(74) *Attorney, Agent, or Firm* — Lerner, David, Littenberg & Krumholz & Mentlik, LLP

(57) ABSTRACT

A microelectronic unit can include a substrate having front and rear surfaces and active semiconductor devices therein, the substrate having a plurality of openings arranged in a symmetric or asymmetric distribution across an area of the rear surface, first and second conductive vias connected to first and second pads exposed at the front surface, pluralities of first and second conductive interconnects extending within respective ones of the openings, and first and second conductive contacts exposed for interconnection with an external element. The plurality of first conductive interconnects can be separated from the plurality of second conductive interconnects by at least one of the plurality of openings, the at least one opening at least partially filled with an insulating material. The distribution of the openings can include at least m openings spaced apart in a first direction and n openings spaced apart in a second direction transverse to the first direction.

40 Claims, 14 Drawing Sheets

(51) Int. Cl.
*H01L 23/15* (2006.01)
*H01L 23/48* (2006.01)
*H01L 23/498* (2006.01)

(56) References Cited

U.S. PATENT DOCUMENTS

| | | | |
|---|---|---|---|
| 7,833,894 B2* | 11/2010 | Hiatt | 438/598 |
| 8,405,196 B2 | 3/2013 | Haba et al. | |
| 2004/0262767 A1 | 12/2004 | Matsuo | |
| 2005/0074961 A1* | 4/2005 | Beyer et al. | 438/619 |
| 2005/0110162 A1 | 5/2005 | Meyer-Berg et al. | |
| 2006/0043598 A1 | 3/2006 | Kirby et al. | |
| 2009/0065907 A1* | 3/2009 | Haba et al. | 257/621 |
| 2009/0294983 A1* | 12/2009 | Cobbley et al. | 257/774 |
| 2010/0032808 A1* | 2/2010 | Ding et al. | 257/621 |
| 2010/0090307 A1 | 4/2010 | Moriya et al. | |
| 2010/0225005 A1* | 9/2010 | Nishio et al. | 257/774 |
| 2012/0018863 A1 | 1/2012 | Oganesian et al. | |
| 2012/0018868 A1 | 1/2012 | Oganesian et al. | |
| 2012/0018893 A1 | 1/2012 | Oganesian et al. | |
| 2012/0018894 A1 | 1/2012 | Oganesian et al. | |
| 2012/0018895 A1 | 1/2012 | Oganesian et al. | |
| 2012/0020026 A1 | 1/2012 | Oganesian et al. | |

OTHER PUBLICATIONS

Partial Inernational Search Report for Application No. PCT/US2012/034038 dated Jul. 20, 2012.

* cited by examiner

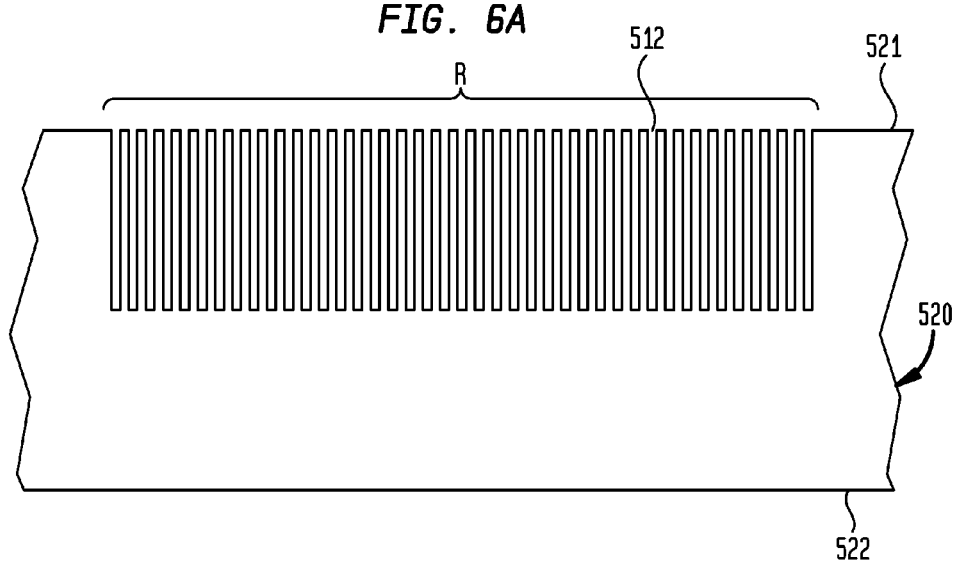
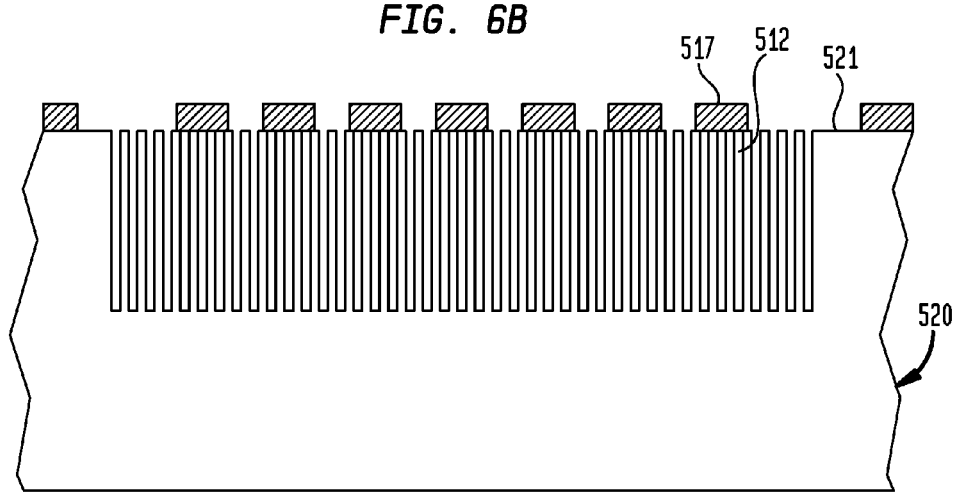

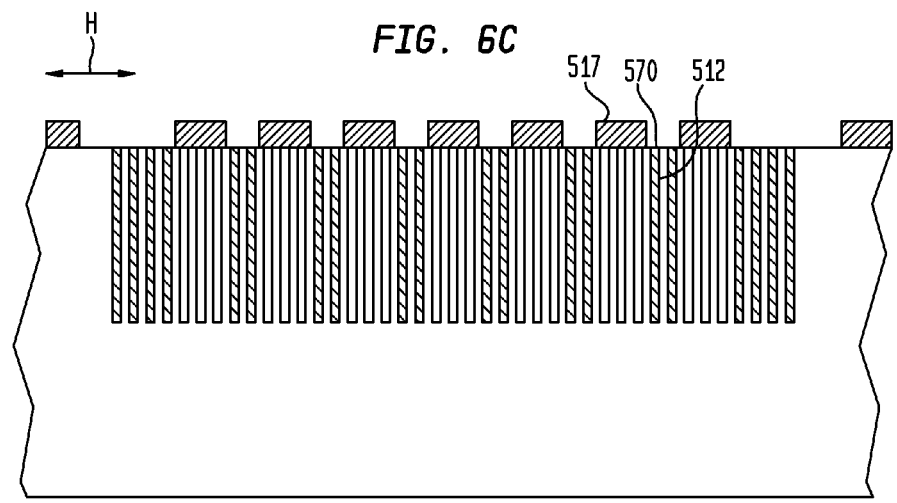
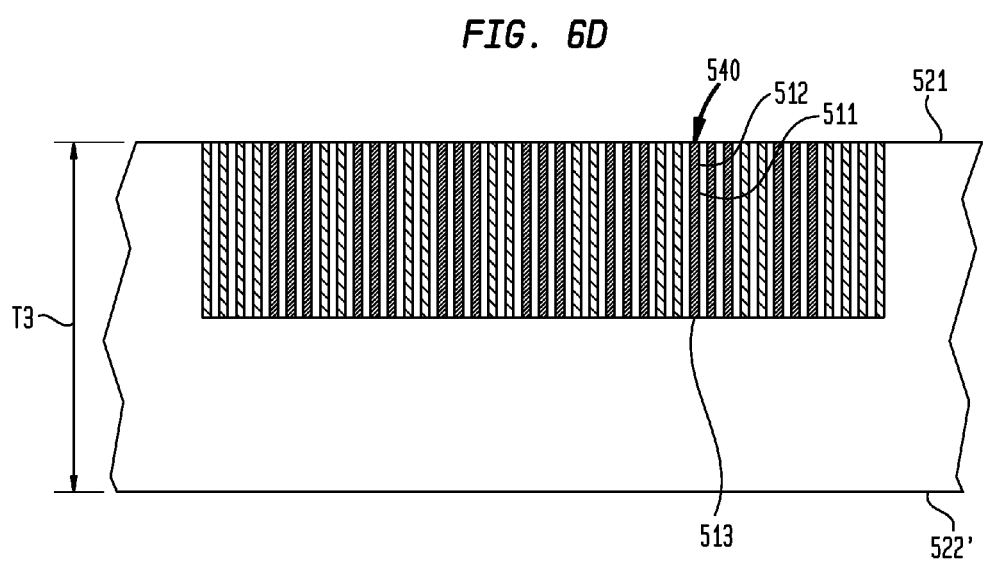

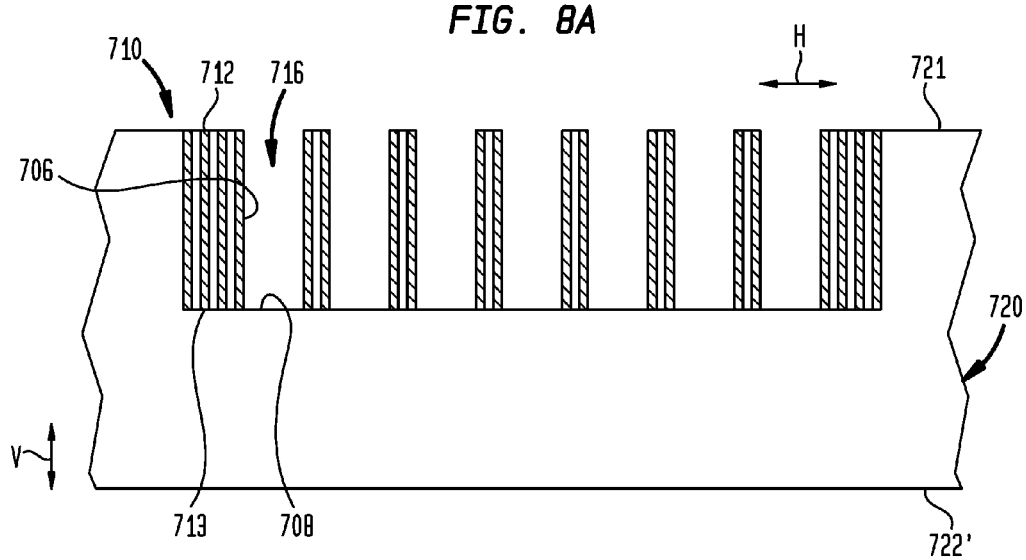
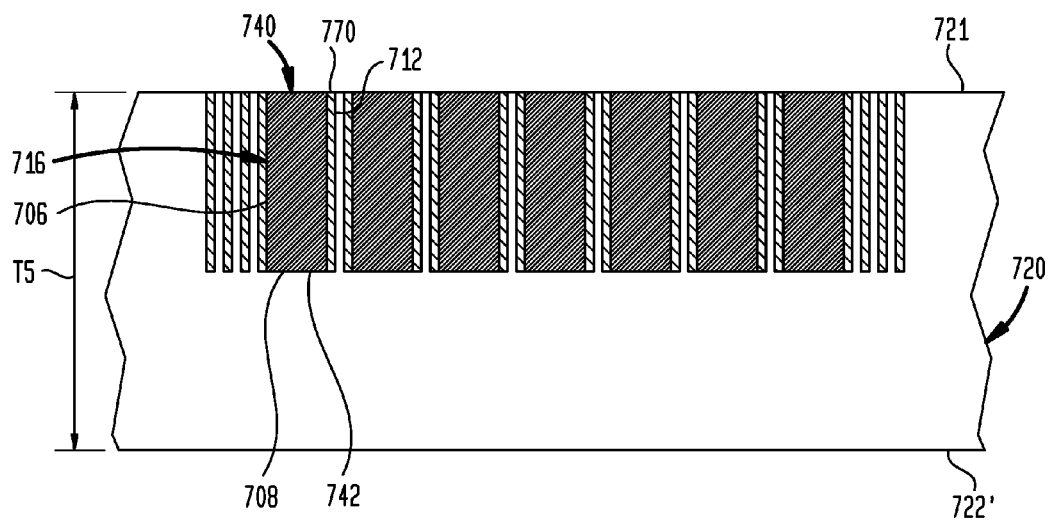

VIAS IN POROUS SUBSTRATES

BACKGROUND OF THE INVENTION

The present invention relates to packaging of microelectronic devices, especially the packaging of semiconductor devices.

Microelectronic elements generally comprise a thin slab of a semiconductor material, such as silicon or gallium arsenide, commonly called a die or a semiconductor chip. Semiconductor chips are commonly provided as individual, prepackaged units. In some unit designs, the semiconductor chip is mounted to a substrate or chip carrier, which is in turn mounted on a circuit panel, such as a printed circuit board.

The active circuitry is fabricated in a first face of the semiconductor chip (e.g., a front surface). To facilitate electrical connection to the active circuitry, the chip is provided with bond pads on the same face. The bond pads are typically placed in a regular array either around the edges of the die or, for many memory devices, in the die center. The bond pads are generally made of a conductive metal, such as copper, or aluminum, around 0.5 μm thick. The bond pads could include a single layer or multiple layers of metal. The size of the bond pads will vary with the device type but will typically measure tens to hundreds of microns on a side.

Through-silicon vias (TSVs) are used to connect the bond pads with a second face of the semiconductor chip opposite the first face (e.g., a rear surface). A conventional via includes a hole penetrating through the semiconductor chip and a conductive material extending through the hole from the first face to the second face. The bond pads may be electrically connected to vias to allow communication between the bond pads and conductive elements on the second face of the semiconductor chip.

Conventional TSV holes may reduce the portion of the first face that can be used to contain the active circuitry. Such a reduction in the available space on the first face that can be used for active circuitry may increase the amount of silicon required to produce each semiconductor chip, thereby potentially increasing the cost of each chip.

Conventional vias may have reliability challenges because of a non-optimal stress distribution inside of the vias and a mismatch of the coefficient of thermal expansion (CTE) between a semiconductor chip, for example, and the structure to which the chip is bonded. For example, when conductive vias within a semiconductor chip are insulated by a relatively thin and stiff dielectric material, significant stresses may be present within the vias. In addition, when the semiconductor chip is bonded to conductive elements of a polymeric substrate, the electrical connections between the chip and the higher CTE structure of the substrate will be under stress due to CTE mismatch.

Size is a significant consideration in any physical arrangement of chips. The demand for more compact physical arrangements of chips has become even more intense with the rapid progress of portable electronic devices. Merely by way of example, devices commonly referred to as "smart phones" integrate the functions of a cellular telephone with powerful data processors, memory and ancillary devices such as global positioning system receivers, electronic cameras, and local area network connections along with high-resolution displays and associated image processing chips. Such devices can provide capabilities such as full internet connectivity, entertainment including full-resolution video, navigation, electronic banking and more, all in a pocket-size device. Complex portable devices require packing numerous chips into a small space. Moreover, some of the chips have many input and output connections, commonly referred to as "I/O's." These I/O's must be interconnected with the I/O's of other chips. The interconnections should be short and should have low impedance to minimize signal propagation delays. The components which form the interconnections should not greatly increase the size of the assembly. Similar needs arise in other applications as, for example, in data servers such as those used in internet search engines. For example, structures which provide numerous short, low-impedance interconnects between complex chips can increase the bandwidth of the search engine and reduce its power consumption.

Despite the advances that have been made in semiconductor via formation and interconnection, there is still a need for improvements in order to minimize the size of semiconductor chips, while enhancing electrical interconnection reliability. These attributes of the present invention may be achieved by the construction of the microelectronic packages as described hereinafter.

BRIEF SUMMARY OF THE INVENTION

In accordance with an aspect of the invention, a microelectronic unit can include a semiconductor substrate having a front surface and a rear surface remote therefrom and embodying a plurality of active semiconductor devices therein, the substrate having a plurality of conductive pads exposed at the front surface and a plurality of openings arranged in a symmetric or asymmetric distribution across an area of the rear surface, first and second conductive vias electrically connected with respective first and second pads of the plurality of conductive pads, pluralities of first and second conductive interconnects extending within respective ones of the openings, and first and second conductive contacts exposed at the rear surface for interconnection with an external element.

The distribution of the openings can include at least m openings spaced apart in a first direction along the rear surface and at least n openings spaced apart in a second direction along the rear surface transverse to the first direction. Each of m and n can be greater than 1. Each first conductive interconnect can be connected to the first conductive via. Each second conductive interconnect can be connected to the second conductive via. The first and second conductive contacts can be electrically connected to the first and second conductive interconnects, respectively. The plurality of first conductive interconnects can be separated from the plurality of second conductive interconnects in a horizontal direction substantially parallel to the front surface by at least one of the plurality of openings. The at least one opening can be at least partially filled with an insulating dielectric material.

In a particular embodiment, each conductive interconnect can include a portion extending in a vertical direction substantially perpendicular to the front surface. The plurality of first conductive interconnects can be separated from one another in the horizontal direction by material of the semiconductor substrate. In one embodiment, each conductive interconnect can have a width in the horizontal direction of 5 microns or less. In an exemplary embodiment, each conductive via can have a frusto-conical shape. In a particular embodiment, the first and second conductive contacts can be aligned in a vertical direction substantially perpendicular to the front surface with the respective pluralities of first and second conductive interconnects. In one embodiment, each pad can have a top surface exposed at the front surface and a bottom surface remote from the top surface. The first conductive vias can extend through the respective first and second pads from the bottom surface to the top surface thereof.

In an exemplary embodiment, the first and second conductive vias may not extend through the respective first and second pads. In a particular embodiment, the microelectronic unit can also include at least one aperture. Each aperture can extend from two or more of the openings to at least a bottom surface of a respective one of the pads. The first and second conductive vias can extend within respective first and second apertures of the at least one aperture. In one embodiment, the first and second conductive vias can include doped semiconductor material. In an exemplary embodiment, the first and second conductive vias can be directly connected to the first and second pads, respectively. In a particular embodiment, the first and second conductive vias can be electrically connected with the respective first and second pads through intermediate conductive structure extending therebetween.

In accordance with another aspect of the invention, an interconnection substrate can include a substrate having an effective CTE less than 8 ppm/° C., having a first surface and a second surface remote therefrom, and having a plurality of openings extending between the first and second surfaces, pluralities of first and second conductive interconnects, each conductive interconnect extending within a respective one of the openings and having ends adjacent the first and second surfaces, and sets of first conductive contacts and sets of second conductive contacts exposed at the first and second surfaces for interconnection with an external element. The openings can be arranged in a symmetric or asymmetric distribution across an area of the first surface. At least m of the openings can be spaced apart in a first direction along the first surface, and at least n of the openings can be spaced apart in a second direction along the first surface transverse to the first direction. Each of m and n can be greater than 1.

Each set of the first conductive contacts can include a first conductive contact exposed at the first surface and a first conductive contact exposed at the second surface, with the plurality of first conductive interconnects electrically connecting such set. Each set of the second conductive contacts can include a second conductive contact exposed at the first surface and a second conductive contact exposed at the second surface, with the plurality of second conductive interconnects electrically connecting such set. The plurality of first conductive interconnects can be separated from the plurality of second conductive interconnects in a horizontal direction substantially parallel to the first surface by an insulating member extending within at least one of the plurality of openings between the first and second surfaces and at least partially filled with an insulating dielectric material.

In one embodiment, each conductive interconnect can include a portion extending in a vertical direction substantially perpendicular to the first surface. The plurality of first conductive interconnects can be separated from one another in the horizontal direction by material of the semiconductor substrate. In a particular embodiment, each conductive interconnect can have a width in the horizontal direction of 5 microns or less. In an exemplary embodiment, the sets of first and second conductive contacts can be aligned in a vertical direction substantially perpendicular to the first surface with the respective pluralities of first and second conductive interconnects. In one embodiment, each opening can be lined with a dielectric layer.

In accordance with yet another aspect of the invention, an interconnection substrate can include a substrate having an effective CTE less than 8 ppm/° C., having a first surface and a second surface remote therefrom, and having a plurality of openings extending between the first and second surfaces, a plurality of conductive interconnects extending within respective ones of a first subset of the openings, and an insulating dielectric material extending at least partially within respective ones of a second subset of the openings. In a particular embodiment, the insulating dielectric material can completely fill respective ones of the second subset of the openings. In one embodiment, the second subset of the openings can include more openings than the first subset of the openings.

In accordance with still another aspect of the invention, an interconnection substrate can include a substrate having an effective CTE less than 8 ppm/° C., having a first surface and a second surface remote therefrom, the substrate having a plurality of openings extending between the first and second surfaces through a region of first material, each opening having first and second ends adjacent the first and second surfaces, respectively. The interconnection substrate can also include a plurality of conductive interconnects extending within respective ones of a first subset of the openings, each conductive interconnect having first and second ends adjacent the first and second surfaces. The interconnection substrate can also include a plurality of insulating members extending within respective ones of a second subset of the openings, each insulating member having first and second opposed end portions within the respective opening adjacent the first and second surfaces, the first and second end portions consisting essentially of a dielectric material, the dielectric material being other than the first material.

At least two of the conductive interconnects can be separated from one another by at least one of the insulating members such that no current can flow through the insulating member between the at least two conductive interconnects and no current can flow through the insulating member between the first and second end portions. In one embodiment, the insulating members can include voids between the first and second end portions. In a particular embodiment, the substrate can consist essentially of semiconductor material. In an exemplary embodiment, the substrate can consist essentially of glass or ceramic material.

Further aspects of the invention provide systems that incorporate conductive via structures according to the foregoing aspects of the invention, composite chips according to the foregoing aspects of the invention, or both in conjunction with other electronic devices. For example, the system may be disposed in a single housing, which may be a portable housing. Systems according to preferred embodiments in this aspect of the invention may be more compact than comparable conventional systems.

In accordance with another aspect of the invention, a method of fabricating a microelectronic unit can include forming a plurality of openings extending from a first surface of a semiconductor substrate towards a second surface remote therefrom, the substrate having a plurality of conductive pads exposed at the second surface, forming pluralities of first and second conductive interconnects extending within respective ones of the openings, and forming first and second conductive vias electrically connected with respective first and second pads of the plurality of conductive pads. The openings can be arranged in a symmetric or asymmetric distribution across an area of the first surface. At least m of the openings can be spaced apart in a first direction along the first surface, and at least n of the openings can be spaced apart in a second direction along the first surface transverse to the first direction. Each of m and n can be greater than 1. The substrate can embody a plurality of active semiconductor devices. Each first conductive interconnect can be electrically connected to the first conductive via. Each second conductive interconnect can be electrically connected to the second conductive via.

In an exemplary embodiment, the method can also include depositing an insulating dielectric material at least partially filling at least one of the plurality of openings. The plurality of first conductive interconnects can be separated from the plurality of second conductive interconnects in a horizontal direction substantially parallel to the first surface by the at least one of the plurality of openings. In a particular embodiment, each conductive interconnect can include a portion extending in a vertical direction substantially perpendicular to the first surface. The plurality of first conductive interconnects can be separated from one another in a horizontal direction substantially parallel to the first surface by material of the semiconductor substrate.

In accordance with yet another aspect of the invention, a method of fabricating a microelectronic unit can include forming a plurality of openings extending from a first surface of a semiconductor substrate towards a second surface remote therefrom, the substrate having a plurality of conductive pads exposed at the second surface, removing material of the semiconductor substrate extending between respective ones of a first and second subset of the openings to form respective first and second cavities occupying areas coextensive with the respective first and second subsets of the openings, forming first and second conductive interconnects extending within the respective first and second cavities, and forming first and second conductive vias electrically connected with respective first and second pads of the plurality of conductive pads.

The openings can be arranged in a symmetric or asymmetric distribution across an area of the first surface. At least m of the openings can be spaced apart in a first direction along the first surface, and at least n of the openings can be spaced apart in a second direction along the first surface transverse to the first direction. Each of m and n can be greater than 1. The substrate can embody a plurality of active semiconductor devices. The first and second conductive vias can be electrically connected with the respective first and second conductive interconnects.

In a particular embodiment, the method can also include depositing an insulating dielectric material at least partially filling at least one of the plurality of openings. The first conductive interconnect can be at least partially separated from the second conductive interconnect in a horizontal direction substantially parallel to the first surface by the at least one of the plurality of openings. In one embodiment, the method can also include forming first and second conductive contacts exposed for interconnection with an external element, the first and second conductive contacts being electrically connected to the first and second conductive interconnects, respectively. In an exemplary embodiment, the first and second conductive contacts can be aligned in a vertical direction substantially perpendicular to the first surface with the respective first and second conductive interconnects. In a particular embodiment, the method can also include forming first and second apertures extending through the respective first and second pads by processing applied to the pads from above the second surface.

In one embodiment, the first and second conductive vias can be formed within the respective first and second apertures and extending through the respective first and second pads. In an exemplary embodiment, a contact portion of each conductive via can be exposed at the second surface for interconnection with an external element. In a particular embodiment, the step of forming the first and second apertures can include removing material from the semiconductor substrate such that the apertures extend partially through a thickness of the semiconductor substrate. In one embodiment, the step of forming the first and second apertures can be performed such that a surface of each of the respective first and second conductive interconnects is exposed within the respective aperture. In an exemplary embodiment, the plurality of openings can be formed such that the first and second conductive vias are exposed within some of the plurality of openings and the first and second conductive interconnects are formed in contact with the first and second conductive vias, respectively.

In accordance with still another aspect of the invention, a method of fabricating an interconnection substrate can include forming a plurality of openings extending from a first surface of a substrate having an effective CTE less than 8 ppm/° C. towards a second surface remote therefrom, forming pluralities of first and second conductive interconnects, and forming sets of first conductive contacts and sets of second conductive contacts exposed at the first and second surfaces for interconnection with an external element. The openings can be arranged in a symmetric or asymmetric distribution across an area of the first surface. At least m of the openings can be spaced apart in a first direction along the first surface, and at least n of the openings can be spaced apart in a second direction along the first surface transverse to the first direction. Each of m and n can be greater than 1.

Each conductive interconnect can extend within a respective one of the openings and can have ends adjacent the first and second surfaces. Each set of the first conductive contacts can include a first conductive contact exposed at the first surface and a first conductive contact exposed at the second surface, with the plurality of first conductive interconnects electrically connecting such set. Each set of the second conductive contacts can include a second conductive contact exposed at the first surface and a second conductive contact exposed at the second surface, with the plurality of second conductive interconnects electrically connecting such set.

In one embodiment, the method can also include depositing an insulating dielectric material at least partially filling at least one of the plurality of openings. The plurality of first conductive interconnects can be separated from the plurality of second conductive interconnects in a horizontal direction substantially parallel to the first surface by the at least one of the plurality of openings. In a particular embodiment, each conductive interconnect can include a portion extending in a vertical direction substantially perpendicular to the first surface. The plurality of first conductive interconnects can be separated from one another in a horizontal direction substantially parallel to the first surface by material of the substrate.

In accordance with another aspect of the invention, a method of fabricating an interconnection substrate can include forming a plurality of openings extending from a first surface of a substrate having an effective CTE less than 8 ppm/° C. towards a second surface remote therefrom, removing material of the semiconductor substrate extending between respective ones of a first and second subset of the openings to form respective first and second cavities occupying areas coextensive with the respective first and second subsets of the openings, forming first and second conductive interconnects extending within the respective first and second cavities, and forming sets of first conductive contacts and sets of second conductive contacts exposed at the first and second surfaces for interconnection with an external element.

The openings can be arranged in a symmetric or asymmetric distribution across an area of the first surface. At least m of the openings can be spaced apart in a first direction along the first surface, and at least n of the openings can be spaced apart in a second direction along the first surface transverse to the first direction. Each of m and n can be greater than 1. Each of the first and second conductive interconnects can have ends adjacent the first and second surfaces. Each set of the first conductive contacts can include a first conductive contact exposed at the first surface and a first conductive contact exposed at the second surface, with the first conductive interconnect electrically connecting such set. Each set of the second conductive contacts can include a second conductive contact exposed at the first surface and a second conductive contact exposed at the second surface, with the second conductive interconnect electrically connecting such set.

In one embodiment, the method can also include depositing an insulating dielectric material at least partially filling at least one of the plurality of openings. The first conductive interconnect can be at least partially separated from the second conductive interconnect in a horizontal direction substantially parallel to the first surface by the at least one of the plurality of openings. In an exemplary embodiment, the method can also include, before the step of forming the conductive contacts, removing material from the second surface, such that a thickness of the semiconductor substrate between the first and second surfaces is reduced, and such that a surface of each conductive interconnect is exposed at the second surface. In a particular embodiment, the substrate can consist essentially of semiconductor material. In one embodiment, the substrate can consist essentially of glass or ceramic material.

In an exemplary embodiment, the step of forming the plurality of openings can be performed by anisotropic etching, such that a region of porous silicon is produced extending from the first surface of the substrate. In one embodiment, the locations of the symmetric or asymmetric distribution of the openings may not be determined by a mask. In a particular embodiment, the first and second conductive vias can be connectable to respective first and second electric potentials. In an exemplary embodiment, the step of depositing the insulating dielectric material can be performed before the steps of forming the conductive interconnects.

BRIEF DESCRIPTION OF THE DRAWINGS

FIGS. 6A-6E are sectional views illustrating stages of fabrication in accordance with the embodiment of the invention depicted in FIG. 5.

FIGS. 8A and 8B are sectional views illustrating stages of fabrication in accordance with the embodiment of the invention depicted in FIG. 7.

DETAILED DESCRIPTION

Figure 1A:
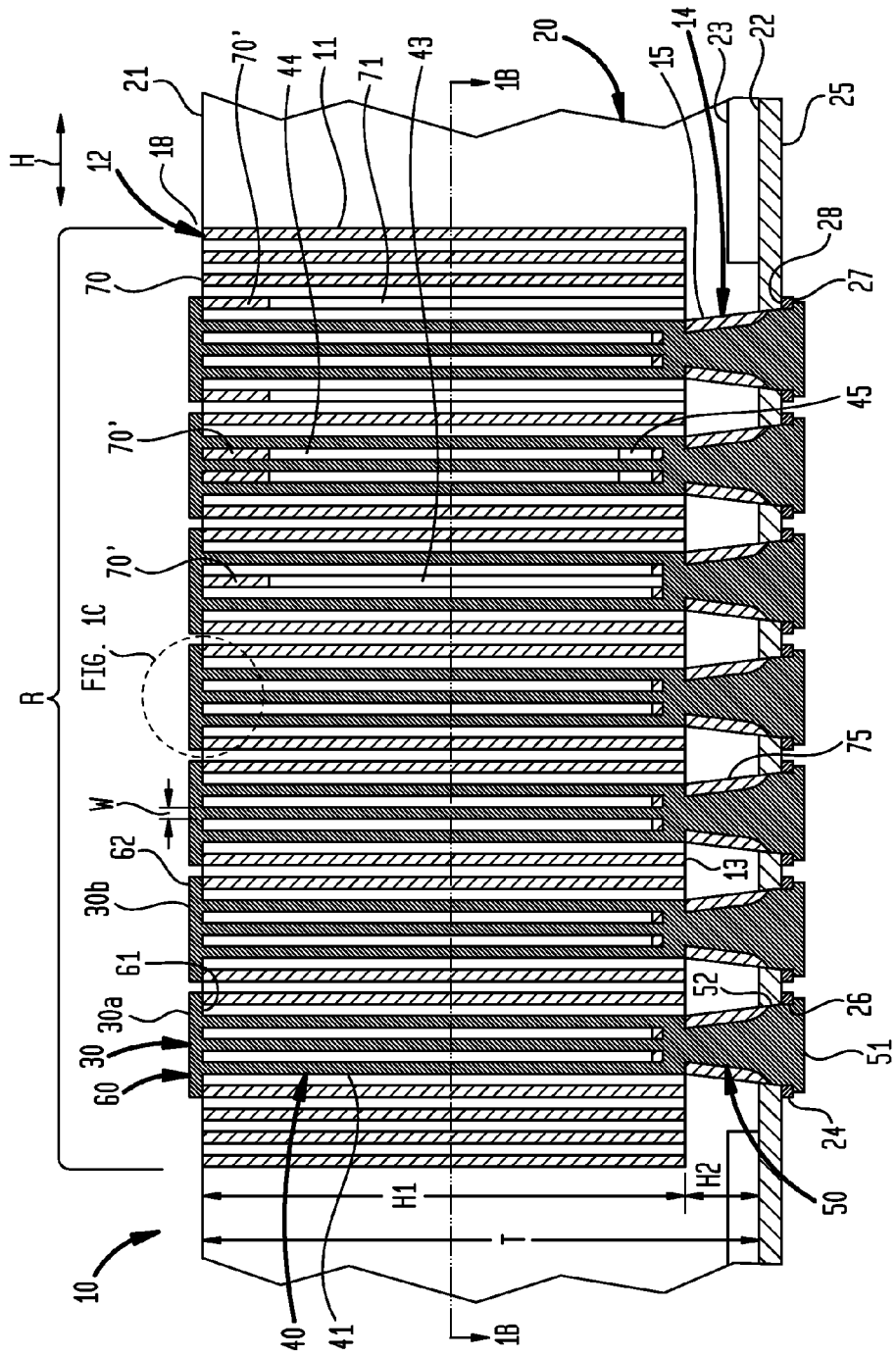
FIG. 1A is a side sectional view illustrating a via structure in accordance with an embodiment of the invention.
Figure 1B:
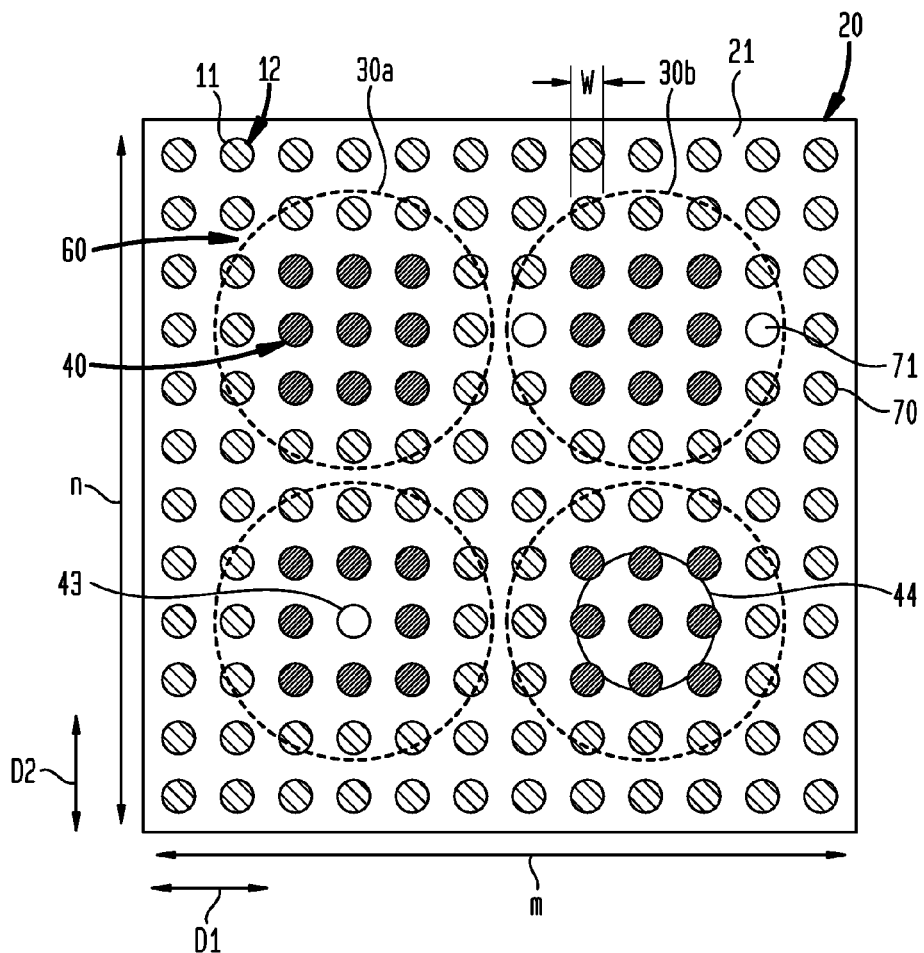
FIG. 1B is top sectional view of the microelectronic unit of FIG. 1A, taken along the line 1B-1B of FIG. 1A, showing a projection of the location of the conductive contacts in dotted lines.

As illustrated in FIGS. 1A and 1B, a microelectronic unit 10 can include a silicon substrate 20 having a rear surface or first surface 21 and a front surface or second surface 22 remote therefrom and a plurality of through-silicon vias 30 ("TSVs") extending therethrough between the front and rear surfaces.

In some embodiments, the microelectronic unit 10 may be a semiconductor chip, a wafer, or the like. The substrate 20 preferably has a coefficient of thermal expansion ("CTE") less than $8*10^{-6}/°$ C. (or ppm/° C.). In a particular embodiment, the substrate 20 can have a CTE less than $7*10^{-6}/°$ C. The substrate 20 may consist essentially of an inorganic material such as silicon. In embodiments wherein the substrate 20 is made of a semiconductor, such as silicon, a plurality of active semiconductor devices (e.g., transistors, diodes, etc.) can be disposed in an active semiconductor region 23 thereof located at and/or below the front surface 22. The thickness of the substrate 20 between the front surface 22 and the rear surface 21 typically is less than 200 µm, and can be significantly smaller, for example, 130 µm, 70 µm or even smaller.

In FIG. 1A, the directions parallel to the rear surface 21 are referred to herein as "horizontal" or "lateral" directions, whereas the directions perpendicular to the rear surface are referred to herein as upward or downward directions and are also referred to herein as the "vertical" directions. The directions referred to herein are in the frame of reference of the structures referred to. Thus, these directions may lie at any orientation to the normal or gravitational frame of reference. A statement that one feature is disposed at a greater height "above a surface" than another feature means that the one feature is at a greater distance in the same orthogonal direction away from the surface than the other feature. Conversely, a statement that one feature is disposed at a lesser height "above a surface" than another feature means that the one feature is at a smaller distance in the same orthogonal direction away from the surface than the other feature.

The substrate 20 can also include a plurality of conductive pads 24 exposed at the front surface 22. While not specifically shown in FIGS. 1A and 1B, the active semiconductor devices in the active semiconductor region 23 typically are conductively connected to the conductive pads 24. The active semiconductor devices, thus, are accessible conductively through wiring incorporated extending within or above one or more dielectric layers of the substrate 20. In some embodiments (not shown), the conductive pads 24 may not be directly exposed at the front surface 22 of the substrate 20. Instead, the conductive pads 24 may be electrically connected to traces extending to terminals that are exposed at the front surface 22 of the substrate 20. The conductive pads 24 and any of the other conductive structures disclosed herein can be made from any electrically conductive metal, including for example, copper, aluminum, or gold. The conductive pads 24 and any of the conductive pads disclosed herein can have any top-view shape, including a circle, oval, triangle, square, rectangle, or any other shape.

As used in this disclosure, a statement that an electrically conductive element is "exposed at" a surface of a substrate indicates that the electrically conductive element is available for contact with a theoretical point moving in a direction perpendicular to the surface of the substrate toward the surface of the substrate from outside the substrate. Thus, a terminal or other conductive element which is exposed at a surface of a substrate may project from such surface; may be flush with such surface; or may be recessed relative to such surface and exposed through a hole or depression in the substrate.

The substrate 20 can further include a dielectric layer 25 located between the front surface 22 and the conductive pads 24. The dielectric layer 25 electrically insulates the conductive pads 24 from the silicon substrate 20. This dielectric layer 25 can be referred to as a "passivation layer" of the microelectronic unit 10. The dielectric layer 25 can include an inorganic or organic dielectric material or both. The dielectric layer 25 may include an electrodeposited conformal coating or other dielectric material, for example, a photoimageable polymeric material, for example, a solder mask material. The substrate can further include another dielectric layer (not shown) overlying the rear surface 21. Such a dielectric layer can electrically insulate conductive elements from the rear surface 21 of the substrate 20.

In the embodiments described herein, the dielectric layer 25 can have a thickness that is substantially less than a thickness of the substrate 20, such that the substrate can have an effective CTE that is approximately equal to the CTE of the material of the substrate, even if the CTE of the dielectric layer 25 is substantially higher than the CTE of the substrate material. In one example, the substrate 20 can have an effective CTE less than $8*10^{-6}/°$ C. (or ppm/° C.).

The substrate 20 can also include a plurality of openings 12 extending from the rear surface 21 partially through the silicon substrate 20 towards the front surface 22. As shown in FIG. 1B, the openings 12 can be arranged in an m×n array, each of m and n being greater than 1. In particular examples, the plurality of openings can be arranged in a symmetric or asymmetric distribution across an area of the rear surface 21, with at least m extending in a first direction D1 and n extending in a second direction D2 transverse thereto, each of m and n being greater than 1.

In a particular embodiment (shown in FIG. 2D), the openings 12 can be arranged in more than one array, including an m1×n1 array in a region A of the microelectronic element 10 and an m2×n2 array in a region B of the microelectronic element, where m1 can be the same or different than m2 and n1 can be the same or different than n2. In one example, where m1 is the same as m2 and n1 is the same as n2, the m1×n1 array can be offset from the n2×m2 array in a horizontal direction D3 substantially parallel to the rear surface 21 of the substrate 20.

The substrate 20 can further include a plurality of apertures 14 extending partially through a thickness T of the substrate 20, each aperture extending from two or more of the openings 12 through a corresponding one of the conductive pads 24. Each aperture 14 includes an inner surface 15 that extends from the conductive pad 24 through the substrate 20 at an angle between 0 and 90 degrees to the horizontal plane defined by the front surface 22. The inner surface 15 can have a constant slope or a varying slope. For example, the angle or slope of the inner surface 15 relative to the horizontal plane defined by the front surface 22 can decrease in magnitude (i.e., become less positive or less negative) as the inner surface penetrates further towards the rear surface 21. In a particular embodiment, each aperture 14 can be tapered in a direction from the corresponding conductive pad 24 towards the openings 12. In some examples, each aperture can have any three-dimensional shape, including for example, a frustoconical shape, a cylinder, a cube, or a prism, among others.

The openings 12 may extend more than half-way from the rear surface 21 towards the front surface 22, such that a height E1 of the openings in a direction perpendicular to the rear surface 21 is greater than a height E2 of the portion of the apertures 14 that extends through the substrate 20.

The plurality of through-silicon vias 30 can include a plurality of conductive interconnects 40 extending within respective ones of the openings 12, a plurality of conductive vias 50 extending within respective ones of the apertures 14, and a plurality of conductive contacts 60 exposed at the rear surface 22 for interconnection with an external element. In a particular embodiment, first and second TSVs 30a, 30b of the plurality of TSVs 30 can be connectable to respective first and second electric potentials.

Each TSV 30 can include a plurality of conductive interconnects 40 that are each electrically connected to a single common conductive via 50 and a single common conductive contact 60. In a particular example, a first TSV 30a can include a plurality of first conductive interconnects 40 extending within respective ones of the openings 12, each of the first conductive interconnects connected to a single common first conductive via 50 and a single common first conductive contact 60, and a second TSV 30b can include a plurality of second conductive interconnects extending within respective ones of the openings, each of the second conductive interconnects connected to a single common second conductive via and a single common second conductive contact.

In one embodiment, each of the plurality of conductive interconnects 40 of a particular TSV 30 can include a portion 41 extending in a vertical direction V substantially perpendicular to the rear surface 21, the plurality of conductive interconnects being separated from one another in a horizontal direction E substantially parallel to the rear surface by material of the silicon substrate 20. In such an embodiment, the vertically-extending portion 41 of each of the conductive interconnects 40 can directly contact material of the silicon substrate 20 adjacent thereto. In a particular example, each conductive interconnect 40 can have a width W in the horizontal direction E of 5 microns or less.

Each TSV 30 can also include a corresponding conductive via 50. Each conductive via 50 can extend within a corresponding aperture 14 and can be electrically connected with a corresponding conductive pad 24. As shown in FIG. 1A, each conductive via 50 can extend through a corresponding conductive pad 24 and can have a contact portion 51 exposed at the front surface 22 of the substrate 20. In such an embodiment, an outer surface 52 of each conductive via 50 can directly contact an inner surface 26 of the conductive pad 24 that is exposed within the corresponding aperture 14. Such an inner surface 26 of the conductive pad 24 can extend between a top surface 27 of the conductive pad exposed at the front surface 22 of the substrate 20 and a bottom surface 28 remote from the top surface. In one embodiment, each conductive via 50 can extend through a corresponding conductive pad 24 from the bottom surface 28 to the top surface 27 thereof.

Connection between each of the conductive vias 50 (or any of the other conductive contacts described herein) and components external to the microelectronic unit 10 can be through conductive masses or conductive bond material (not shown).

Such conductive masses can comprise a fusible metal having a relatively low melting temperature, e.g., solder, tin, or a eutectic mixture including a plurality of metals. Alternatively, such conductive masses can include a wettable metal, e.g., copper or other noble metal or non-noble metal having a melting temperature higher than that of solder or another fusible metal. Such wettable metal can be joined with a corresponding feature, e.g., a fusible metal feature of an interconnect element. In a particular embodiment, such conductive masses can include a conductive material interspersed in a medium, e.g., a conductive paste, e.g., metal-filled paste, solder-filled paste or isotropic conductive adhesive or anisotropic conductive adhesive.

Similar to the corresponding aperture 14, the outer surface 52 of each conductive via 50 can extend from the conductive pad 24 through the substrate 20 at an angle between 0 and 90 degrees to the horizontal plane defined by the front surface 22. The outer surface 52 can have a constant slope or a varying slope. For example, the angle or slope of the outer surface 52 relative to the horizontal plane defined by the front surface 22 can decrease in magnitude as the outer surface penetrates further towards the rear surface 21. In a particular embodiment, each conductive via 50 can be tapered in a direction from the corresponding conductive pad 24 towards the openings 12. In some examples, each conductive via 50 can have any three-dimensional shape, including for example, a frustoconical shape, a cylinder, a cube, or a prism, among others.

As shown in FIG. 1A, the conductive vias 50 are solid. In other embodiments (not shown), each conductive via can include an internal space that is filled with a dielectric material. The conductive vias 50 can be formed either solid or hollow depending upon the process conditions. Under appropriate process conditions, a conductive via 50 that includes an internal space can be produced, and that internal space can then be filled with a dielectric material.

Each TSV 30 can further include a corresponding conductive contact 60 exposed at the rear surface 21 for interconnection with an external element. Each conductive contact 60 can be electrically connected to each of the conductive interconnects 40 of its TSV 30 at a bottom surface of the conductive contact. In one embodiment, each conductive contact 60 can be aligned in the vertical direction V with the respective plurality of conductive interconnects 40 of its TSV 30. In such an embodiment, as shown in FIG. 1B, the conductive contact 60 can overlie all of the conductive interconnects 40 in the first direction D1 and in the second direction D2 transverse thereto.

In a particular embodiment, a plane defined by a top surface 62 of the conductive contact 60 can be substantially parallel to the plane defined by the rear surface 21 of the substrate 20. As shown, the bottom surface 61 of the conductive contact 60 is located approximately at a plane defined by the rear surface 21 of the substrate 20. In other embodiments, the bottom surface 61 of the conductive contact 60 can be located above or below the plane defined by the rear surface 21. In some embodiments (not shown), a conductive mass or conductive bond material as described above can be exposed at the top surface 62 of the conductive contact 60 for interconnection to an external element.

As shown, the conductive contact 60 has the shape of a conductive bond pad, e.g., a thin flat member. In particular examples, each of the conductive contacts 60 (and any of the other conductive contacts described herein) can have any top-view shape, including, for example, a circular pad shape a rectangular shape, an oval shape, a square shape, a triangular shape, or a more complex shape. Each of the conductive contacts 60 can have any three-dimensional shape, including, for example, a frustoconical-shaped conductive post. Examples of conductive posts can be used, as shown and described in the commonly-owned U.S. patent application Ser. No. 12/832,376, filed on Jul. 8, 2010.

The microelectronic unit 10 can further include an insulating dielectric material 70 extending within each of a plurality of the openings 12. Such a dielectric material 70 can extend within at least some of the openings 12 that are located between a plurality of first conductive interconnects 40 of a first TSV 30a and a plurality of second conductive interconnects 40 of a second TSV 30b, such that at least one of the openings containing the dielectric material can separate the plurality of first conductive interconnects from the plurality of second conductive interconnects in the horizontal direction E. The dielectric material 70 can at least partially electrically isolate the conductive interconnects 40 of the first TSV 30a from the conductive interconnects 40 of the second TSV 30b. The dielectric material 70 can also extend within at least some of the openings 12 that are located near an outer perimeter 18 of a porous silicon region R of the substrate 20. The insulating dielectric material 70 can include an inorganic or organic dielectric material or both. In a particular embodiment, the insulating dielectric material 70 can include a compliant dielectric material, such that the insulating dielectric material has a sufficiently low modulus of elasticity and sufficient thickness such that the product of the modulus and the thickness provide compliancy.

In a particular embodiment, some of the openings 12 that are located around the conductive interconnects 40 of a particular TSV 30 can be only partially filled with an insulating dielectric material 70', such that a void 71 is located between the dielectric material and the bottom surface 13 of the respective opening 12. Such voids 71 (and all of the other voids described herein) can be filled with air, or in particular embodiments, such voids can be filled with a dielectric material such as the insulating dielectric material 70.

In one example, one or more of the openings 12 that underlies the conductive contact 60 of a particular TSV 30 can be left open rather than being filled with a conductive interconnect 40, such that a void 43 is located within the opening. Such openings 12 can be partially filled with an insulating dielectric material 70', such that the void 43 can be located between the dielectric material and the bottom surface 13 of the respective opening. In a particular example, one or more of the openings 12 that underlies the conductive contact 60 of a particular TSV 30 can be entirely filled with an insulating dielectric material 70.

In an exemplary embodiment, some of the material of the substrate 20 can be removed between adjacent ones of the conductive interconnects 40 of a particular TSV 30, such that a void 44 extends between two or more adjacent ones of the conductive interconnects, along at least a portion of the height E1 of the conductive interconnects. In such an embodiment, a portion 45 of the material of the substrate 20 extending between such adjacent conductive interconnects 40 can remain, such that the void 44 does not extend all of the way down to the depth of the bottom surface 13 of the openings 12. In a particular example, such a void 44 can be partially or entirely filled with an insulating dielectric material 70'. In one example, the insulating dielectric material 70' can be epoxy.

In exemplary embodiments, such voids 71, 43, and 44 can provide the conductive interconnects 40 additional room to expand without generating as much stress within the substrate and/or against the contacts 60 and/or against the conductive vias 50 as if the voids were not present. Such voids can improve the performance of the microelectronic unit in such embodiments, particularly when there is a relatively large mismatch between the CTE of the material of the substrate 20 and the CTE of the material of the conductive interconnects 40.

The microelectronic unit 10 can further include an insulating dielectric layer 75 extending within each of the apertures 14 and overlying the inner surface 15 of each aperture. In one example, such an insulating dielectric layer 75 can conformally coat the inner surface 15 exposed within the aperture 14. Each insulating dielectric layer 75 can separate and electrically insulate a conductive via 50 from the inner surface 15 of the aperture 14, such that the conductive via is at least partially electrically isolated form material of the substrate 20. In a particular embodiment, the insulating dielectric layer 75 can also overlie the inner surface 26 of the corresponding conductive pad 24. In such an embodiment, the conductive via 50 can contact the conductive pad 24 at the top surface 27 thereof rather than at the inner surface 26. The insulating dielectric layer 75 can include an inorganic or organic dielectric material or both. In a particular embodiment, the insulating dielectric layer 75 can include a compliant dielectric material.

Figure 1C:
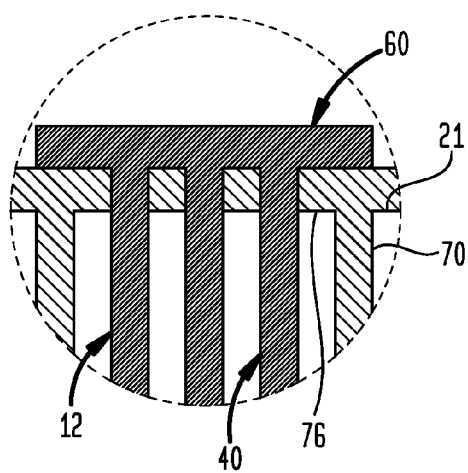
FIG. 1C is a partial sectional view of the microelectronic unit of FIG. 1A, illustrating an embodiment of a via structure that includes a dielectric layer underlying portions of the conductive contacts exposed at the rear surface of the substrate.

As shown in FIG. 1C, the microelectronic unit 10 can further include an insulating dielectric layer 76 overlying the rear surface 21 of the substrate 20, such that the conductive contacts 60 overlie the insulating dielectric layer 76. In one example, such an insulating dielectric layer 76 can conformally coat the portions of the rear surface 21 extending between adjacent openings 12. The insulating dielectric layer 76 can separate and electrically insulate the conductive contacts 60 from the material of the substrate 20. The insulating dielectric layer 76 can include an inorganic or organic dielectric material or both. In a particular embodiment, the insulating dielectric layer 76 can include a compliant dielectric material.

The microelectronic unit 10 can further include an insulating dielectric layer (not shown) overlying inner surfaces 11 of the openings 12, such that the conductive interconnects 40 extend within such an insulating dielectric layer. In one example, such an insulating dielectric layer can conformally coat the inner surfaces 11 of the openings 12. The insulating dielectric layer can separate and electrically insulate the conductive interconnects 40 from the material of the substrate 20. The insulating dielectric layer can include an inorganic or organic dielectric material or both. In a particular embodiment, the insulating dielectric layer can include a compliant dielectric material.

Figure 2A:
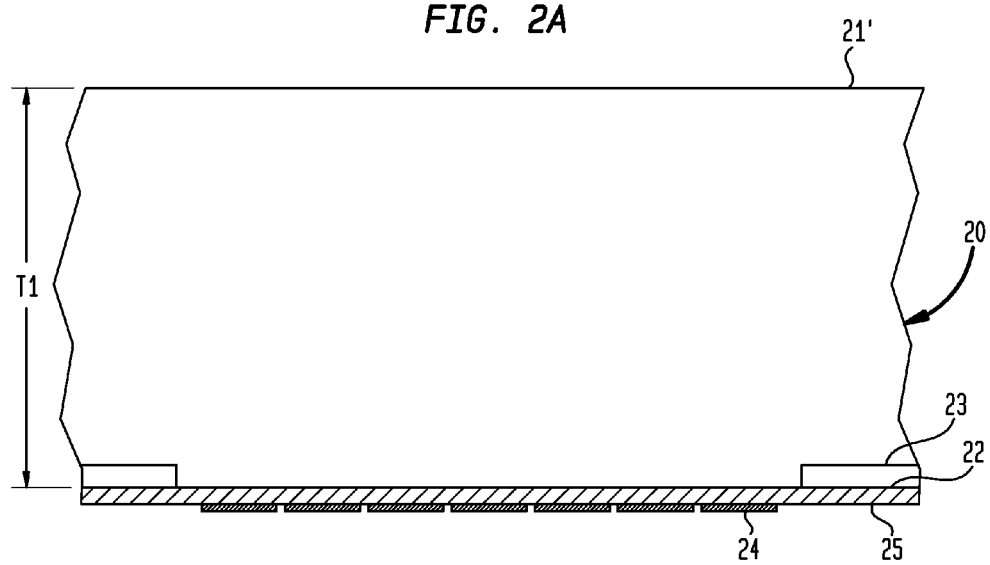
FIGS. 2A-2C and 2E-2I are sectional views illustrating stages of fabrication in accordance with the embodiment of the invention depicted in FIGS. 1A and 1B.

A method of fabricating the microelectronic unit 10 (FIGS. 1A and 1B) will now be described, with reference to FIGS. 2A-2I. As illustrated in FIG. 2A, a silicon substrate 20 can have an active semiconductor region 23 thereof located at and/or below the front surface 22. The substrate 20 can also include a plurality of conductive pads 24 exposed at the front surface 22. The substrate 20 can further include a dielectric layer 25 located between the front surface 22 and the conductive pads 24.

Figure 2B:
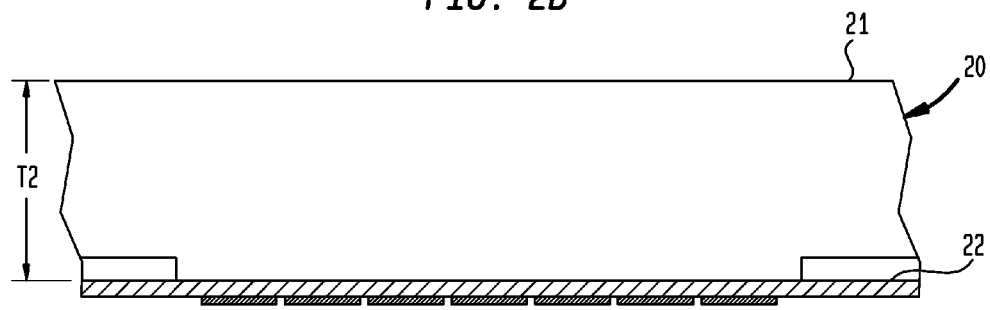

As illustrated in FIG. 2B, the thickness of the substrate 20 between the front surface 22 and an initial rear surface 21' can be reduced, thereby exposing a final rear surface 21. Grinding, lapping, or polishing of the initial rear surface 21' or a combination thereof can be used to reduce the thickness of the substrate 20. During this step, as an example, the initial thickness T1 (shown in FIG. 2A) of the substrate 20 can be reduced from about 700 µm to a thickness T2 (shown in FIG. 2B) of about 130 µm or less.

Figure 2C:
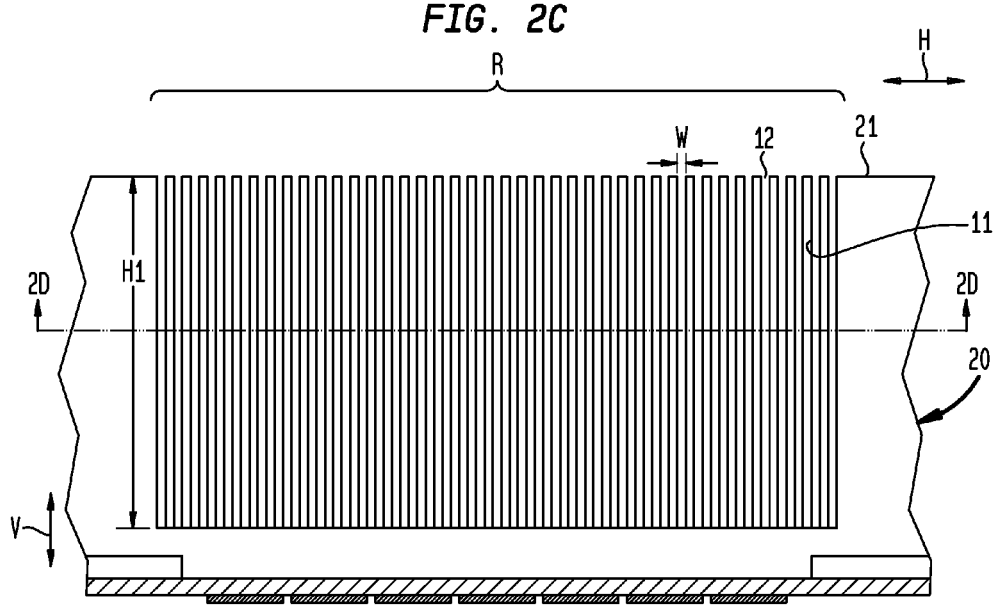

Thereafter, as illustrated in FIG. 2C, material can be removed from the rear surface 21 of the substrate 20 to form a plurality of openings 12 extending from the first surface towards the front surface 22. In a particular example, the openings 12 can be arranged in m×n array, each of m and n being greater than 1, each opening extending in the vertical direction V. In one embodiment, the plurality of openings 12 can be arranged in a symmetric or asymmetric distribution across an area of the rear surface 21, with at least m extending in a first direction D1 and n extending in a second direction D2 transverse thereto (FIG. 1B), each of m and n being greater than 1.

In one example, each of the openings 12 can have a width W' in the horizontal direction E of 5 microns or less. Each opening 12 can have a length E1 in the vertical direction V. In one embodiment, the ratio of the length E1 to the width W' of each opening 12 can be at least 10. In a particular example, the length E1 of each opening 12 can be at least 150 microns. In another example, the openings 12 can define a pitch in the horizontal direction E of 10 microns or less.

In a particular embodiment, the openings 12 can be a plurality of pores that are formed by anisotropic etching, such that a region R of porous silicon is produced extending from the rear surface 21 of the substrate 20. In such an anisotropic etching process, the region R of porous silicon can be formed by electrochemical dissolution of the silicon substrate 20 in a solution based on hydrofluoric acid. The rear surface 21 of the silicon substrate 20 to be made porous can be placed in contact with the hydrofluoric acid that is in contact with a first electrode while the front surface 22 can be contacted to a second electrode to form an anodization circuit.

At a high anodic current, the rear surface 21 of the silicon substrate 20 can undergo electro-polishing. When the current is low, the morphology of the surface 21 can become dominated by a dense array of openings or pores 12 penetrating deeply into the bulk of the silicon substrate. Initially, the pores 12 can start forming in a randomly distributed array. When the adjacent pores 12 grow, their depletion zones overlap and this can stops the sideways etching in the horizontal direction E. The etching can only proceed in the vertical direction V, hence shifting from isotropic to anisotropic. This process can be self-regulating because eventually, the pores 12 cannot further increase in diameter due to depletion zones acting as etch stops along inner surfaces 11 of the pores. This forces the etching to occur only at the bottom of the pores. In such an embodiment, the locations of the symmetric or asymmetric distribution of the openings 12 are not determined by a mask.

Figure 2D:
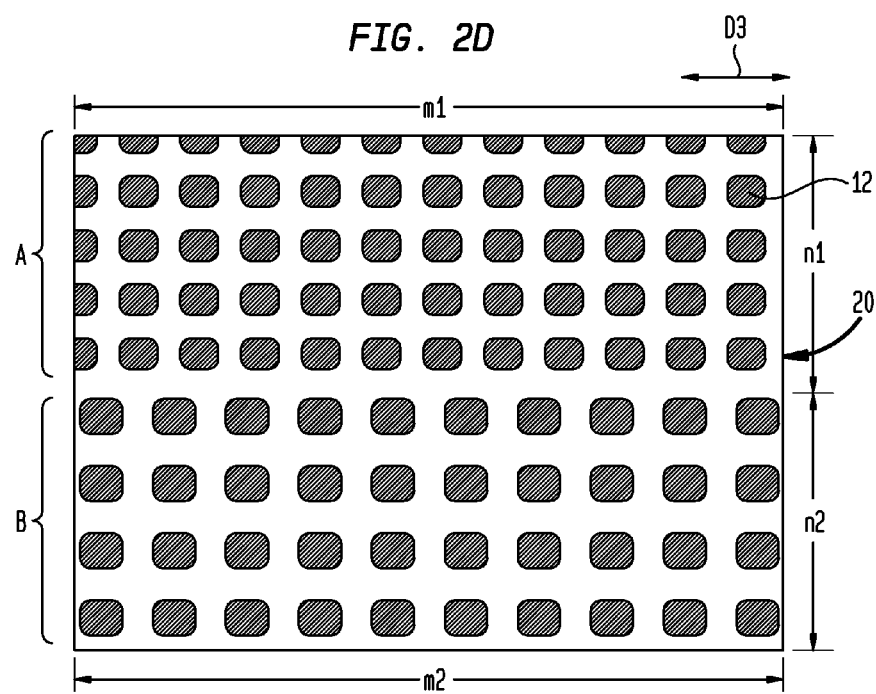
FIG. 2D is an enlarged fragmentary sectional view of a portion of the stage of fabrication depicted in FIG. 2C, taken across the line 2D-2D.

After such an anisotropic etching process, the first openings 12 can be arranged in m×n array, each of m and n being greater than 1. In a particular embodiment, the openings 12 can be arranged in more than one array, as shown in FIG. 2D, including an m1×n1 array in a first region A of the substrate 20 and an m2×n2 array in a second region B of the substrate, where m1 can be the same or different than m2 and n1 can be the same or different than n2.

Figure 2E:
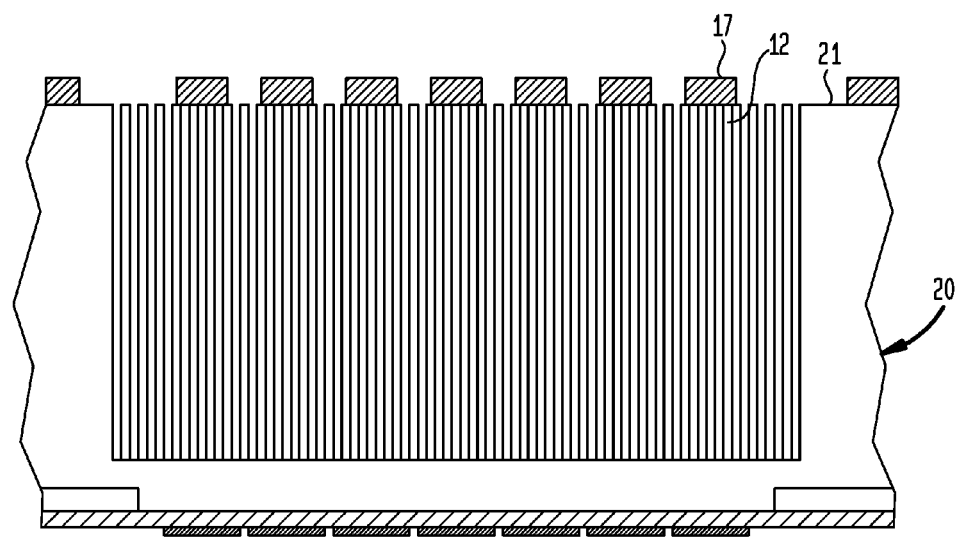
Figure 2F:
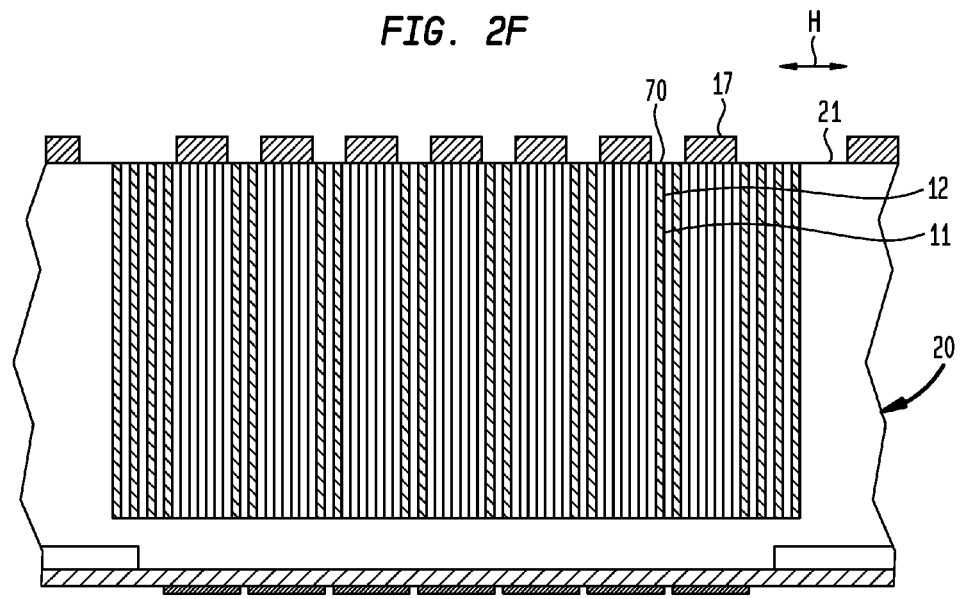
Figure 2G:
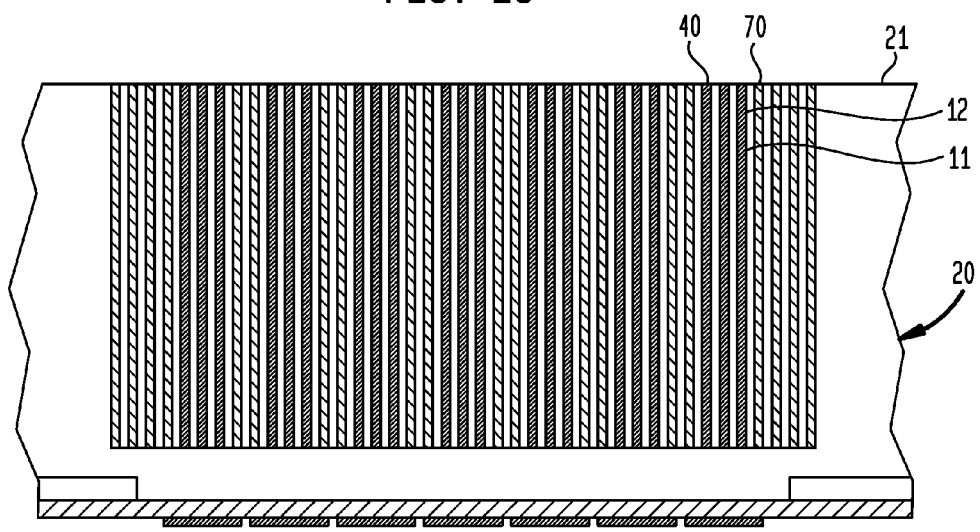
Figure 2H:
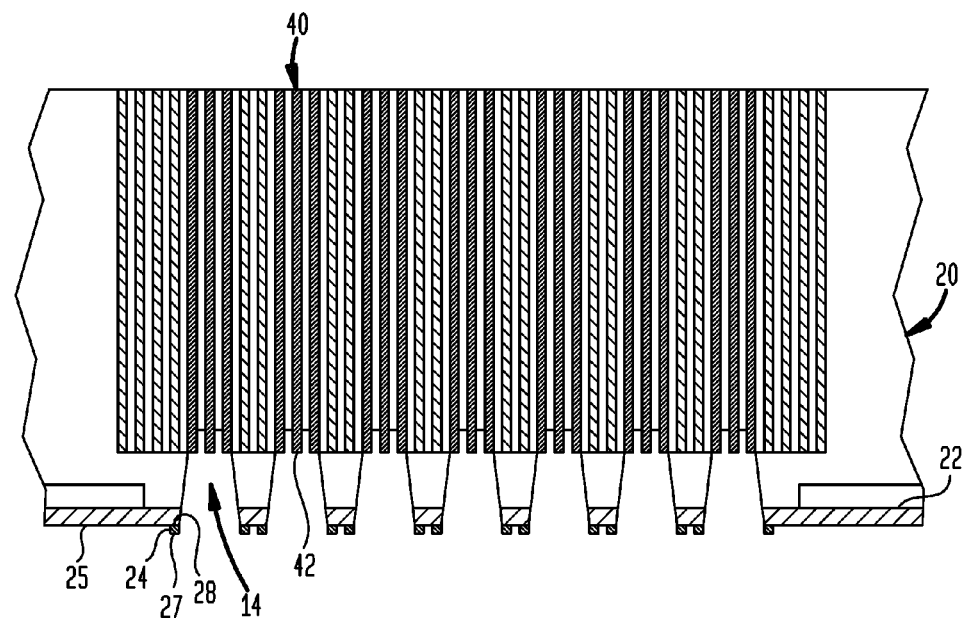

In a particular embodiment (not shown), after the openings 12 are formed, an insulating dielectric layer (not shown) can be deposited overlying the inner surfaces 11 of the openings 12, such that the conductive interconnects 40 will extend within such an insulating dielectric layer when they are deposited within the openings (FIG. 2G).

In one embodiment having an insulating dielectric layer overlying the inner surfaces 11 of the openings 12, a mask can be applied to portions of the rear surface 21 of the substrate having openings in which it is desired not to form such a dielectric layer. Such uncoated ones of the openings 12 can be later filled with conductive interconnects 40 that have portions directly contacting material of the substrate 20. Such conductive interconnects 40 can be included in a particular TSV 30 that can include a ground pad of the conductive pads 24.

Various methods can be used to form such an insulating dielectric layer overlying the inner surfaces 11 of the openings 12, and such methods are described below with reference to FIG. 2F. In particular examples, chemical vapor deposition (CVD) or atomic layer deposition (ALD) can be used to deposit a thin insulating dielectric layer overlying the inner surfaces 11 of the openings 12. In one example, tetraethylorthosilicate (TEOS) can be used during a low-temperature process for depositing such an insulating dielectric layer. In exemplary embodiments, a layer of silicon dioxide, borophosphosilicate glass (BPSG), borosilicate glass (BSG), or phosphosilicate glass (PSG) can be deposited overlying the inner surfaces 11 of the openings 12, and such glass can be doped or undoped.

Thereafter, as illustrated in FIG. 2E, a mask layer 17 can be deposited overlying particular openings 12 or groups of openings 12 at the rear surface 21 of the substrate 20 where it is desired to prevent the deposit of metal when forming the conductive interconnects 40 (FIG. 2G). For example, a mask layer 17 such as a photoimageable layer, e.g., a photoresist layer, can be deposited and patterned to cover only portions of the rear surface 21.

Thereafter, as illustrated in FIG. 2F, an insulating dielectric material 70 can be formed extending within the openings 12 that are not covered by the mask layer 17. Such a dielectric material 70 can extend within at least some of the openings 12 that are located between the openings 12 that will later include a plurality of first conductive interconnects 40 of a first TSV 30a and a plurality of second conductive interconnects 40 of a second TSV 30b, such that at least one of the openings containing the insulating dielectric material can separate the plurality of first conductive interconnects from the plurality of second conductive interconnects in the horizontal direction E.

Various methods can be used to form the insulating dielectric material 70. In one example, a flowable dielectric material can be applied to the rear surface 21 of the substrate 20, and the flowable material can then more evenly distributed across the inner surfaces 11 of the openings 12 during a "spin-coating" operation, followed by a drying cycle which may include heating. In another example, a thermoplastic film of dielectric material can be applied to the rear surface 21 after which the assembly is heated, or is heated in a vacuum environment, i.e., placed in an environment under lower than ambient pressure. In another example, vapor deposition can be used to form the insulating dielectric material 70.

In still another example, the assembly including the substrate 20 can be immersed in a dielectric deposition bath to form a conformal dielectric coating or insulating dielectric material 70. As used herein, a "conformal coating" is a coating of a particular material that conforms to a contour of the surface being coated, such as when the insulting dielectric material 70 conforms to a contour of the inner surfaces 11 of the openings 12. An electrochemical deposition method can be used to form the conformal dielectric material 70, including for example, electrophoretic deposition or electrolytic deposition.

In one example, an electrophoretic deposition technique can be used to form a conformal dielectric coating, such that the conformal dielectric coating is only deposited onto exposed conductive and semiconductive surfaces of the assembly. During deposition, the semiconductor device wafer is held at a desired electric potential and an electrode is immersed into the bath to hold the bath at a different desired potential. The assembly is then held in the bath under appropriate conditions for a sufficient time to form an electrodeposited conformal dielectric material 70 on exposed surfaces of the substrate which are conductive or semiconductive, including but not limited to along the inner surfaces 11 of the openings 12. Electrophoretic deposition occurs so long as a sufficiently strong electric field is maintained between the surface to be coated thereby and the bath. As the electrophoretically deposited coating is self-limiting in that after it reaches a certain thickness governed by parameters, e.g., voltage, concentration, etc. of its deposition, deposition stops.

Electrophoretic deposition forms a continuous and uniformly thick conformal coating on conductive and/or semiconductive exterior surfaces of the substrate 20. In addition, the electrophoretic coating can be deposited so that it does not form on a remaining passivation layer overlying the rear surface 21 of the substrate 20, due to its dielectric (nonconductive) property. Stated another way, a property of electrophoretic deposition is that it does not normally form on a layer of dielectric material, and it does not form on a dielectric layer overlying a conductor provided that the layer of dielectric material has sufficient thickness, given its dielectric properties. Typically, electrophoretic deposition will not occur on dielectric layers having thicknesses greater than about 10 microns to a few tens of microns. A conformal dielectric material 70 can be formed from a cathodic epoxy deposition precursor. Alternatively, a polyurethane or acrylic deposition precursor could be used. A variety of electrophoretic coating precursor compositions and sources of supply are listed in Table 1 below.

TABLE 1

| ECOAT NAME | POWERCRON 645 | POWERCRON 648 | CATHOGUARD 325 |
|---|---|---|---|
| MANUFACTURERS | | | |
| MFG | PPG | PPG | BASF |
| TYPE | CATHODIC | CATHODIC | CATHODIC |
| POLYMER BASE | EPOXY | EPOXY | EPOXY |
| LOCATION | Pittsburgh, PA | Pittsburgh, PA | Southfield, MI |
| APPLICATION DATA | | | |
| Pb/Pf-free | Pb-free | Pb or Pf-free | Pb-free |
| HAPs, g/L | | 60-84 | COMPLIANT |
| VOC, g/L (MINUS WATER) | | 60-84 | <95 |
| CURE | 20 min/175 C. | 20 min/175 C. | |
| FILM PROPERTIES | | | |
| COLOR | Black | Black | Black |
| THICKNESS, μm | 10-35 | 10-38 | 13-36 |

TABLE 1-continued

| PENCIL HARDNESS | | 2H+ | 4H |
|---|---|---|---|
| BATH CHARACTERISTICS | | | |
| SOLIDS, % wt. | 20 (18-22) | 20 (19-21) | 17.0-21.0 |
| pH (25 C.) | 5.9 (5.8-6.2) | 5.8 (5.6-5.9) | 5.4-6.0 |
| CONDUCTIVITY (25 C.) µS | 1000-1500 | 1200-1500 | 1000-1700 |
| P/B RATIO | 0.12-0.14 | 0.12-0.16 | 0.15-0.20 |
| OPERATION TEMP., C. | 30-34 | 34 | 29-35 |
| TIME, sec | 120-180 | 60-180 | 120+ |
| ANODE | SS316 | SS316 | SS316 |
| VOLTS | | 200-400 | >100 |

| ECOAT NAME | ELECTROLAC | LECTRASEAL DV494 | LECTROBASE 101 |
|---|---|---|---|
| MANUFACTURERS | | | |
| MFG | MACDERMID | LVH COATINGS | LVH COATINGS |
| TYPE | CATHODIC | ANODIC | CATHODIC |
| POLYMER BASE | POLYURETHANE | URETHANE | URETHANE |
| LOCATION | Waterbury, CT | Birmingham, UK | Birmingham, UK |
| APPLICATION DATA | | | |
| Pb/Pf-free | | Pb-free | Pb-free |
| HAPs, g/L | | | |
| VOC, g/L (MINUS WATER) | | | |
| CURE | 20 min/149 C. | 20 min/175 C. | 20 min/175 C. |
| FILM PROPERTIES | | | |
| COLOR | Clear (+dyed) | Black | Black |
| THICKNESS, µm | | 10-35 | 10-35 |
| PENCIL HARDNESS | 4H | | |
| BATH CHARACTERISTICS | | | |
| SOLIDS, % wt. | 7.0 (6.5-8.0) | 10-12 | 9-11 |
| pH (25 C.) | 5.5-5.9 | 7-9 | 4.3 |
| CONDUCTIVITY (25 C.) µS | 450-600 | 500-800 | 400-800 |
| P/B RATIO | | | |
| OPERATION TEMP., C. | 27-32 | 23-28 | 23-28 |
| TIME, sec | | | 60-120 |
| ANODE | SS316 | 316SS | 316SS |
| VOLTS | 40, max | | 50-150 |

In another example, the dielectric material 70 can be formed electrolytically. This process is similar to electrophoretic deposition, except that the thickness of the deposited layer is not limited by proximity to the conductive or semi-conductive surface from which it is formed. In this way, an electrolytically deposited dielectric layer can be formed to a thickness that is selected based on requirements, and processing time is a factor in the thickness achieved.

Thereafter, as illustrated in FIG. 2G, the mask layer 17 can be removed from the rear surface 21, and the plurality of conductive interconnects 40 can be formed extending within the openings 12 that remain unoccupied after formation of the dielectric material 70 in some of the openings. The conductive interconnects 40 can overlie the inner surfaces 11 of the openings 12.

To form the conductive interconnects 40 (and any of the other conductive elements described herein), an exemplary method involves depositing a metal layer by one or more of sputtering a primary metal layer onto exposed surfaces of the substrate 20 and the openings 12, plating, or mechanical deposition. Mechanical deposition can involve the directing a stream of heated metal particles at high speed onto the surface to be coated. This step can be performed by blanket deposition onto the rear surface 21 and the inner surfaces 11, for example. In one embodiment, the primary metal layer includes or consists essentially of aluminum. In another particular embodiment, the primary metal layer includes or consists essentially of copper. In yet another embodiment, the primary metal layer includes or consists essentially of titanium.

One or more other exemplary metals can be used in a process to form the conductive interconnects 40 (and any of the other conductive elements described herein). In particular examples, a stack including a plurality of metal layers can be formed on one or more of the aforementioned surfaces. For example, such stacked metal layers can include a layer of titanium followed by a layer of copper overlying the titanium (Ti—Cu), a layer of nickel followed by a layer of copper overlying the nickel layer (Ni—Cu), a stack of nickel-titanium-copper (Ni—Ti—Cu) provided in similar manner, or a stack of nickel-vanadium (Ni—V), for example.

While essentially any technique usable for forming conductive elements can be used to form the conductive elements described herein, particular techniques as discussed in greater detail in the commonly owned U.S. patent application Ser. No. 12/842,669, filed Jul. 23, 2010, can be employed, which is hereby incorporated by reference herein. Such techniques can include, for example, selectively treating a surface with a laser or with mechanical processes such as milling or sandblasting so as to treat those portions of the surface along the path where the conductive element is to be formed differently than other portions of the surface. For example, a laser or mechanical process may be used to ablate or remove a material such as a sacrificial layer from the surface only along a particular path and thus form a groove extending along the path. A material such as a catalyst can then be deposited in the groove, and one or more metallic layers can be deposited in the groove.

After formation of the conductive interconnects 40, in one embodiment (shown in FIG. 1B) wherein a void 44 extends between two or more adjacent ones of the conductive interconnects, such a void 44 can be formed by removing material of the substrate 20 between adjacent ones of the conductive interconnects. In a particular example, such a void 44 can then be partially or entirely filled with an insulating dielectric material 70'.

Thereafter, as illustrated in FIG. 2E, a mask layer (not shown) can be deposited onto the front surface 21 and the conductive pads 24 where it is desired to preserve remaining portions of the front surface and the conductive pads. For example, a photoimageable layer, e.g., a photoresist layer, can be deposited and patterned to cover only portions of the front surface 22 and the conductive pads 24. Then, an etch process can be applied to the portion of the conductive pads 24 exposed within the mask openings so as to remove the metal of the conductive pad underlying the mask opening. As a result, an aperture 14 is formed that extends through the conductive pad 24 from the top surface 27 to the bottom surface 28 thereof.

Thereafter, another etch process can be conducted in a manner that selectively etches the silicon substrate 20, thereby extending the aperture 14 into the substrate partially through a thickness of the substrate from the front surface 22 to the openings 12. In one example, such an etch process can be applied to the conductive pads 24 from above the front surface 22 of the substrate 20 to form the apertures 14. In a particular embodiment, a lower surface 42 of each of the conductive interconnects 40 of a corresponding TSV 30 is exposed within each respective aperture 14.

A portion of the passivation layer 25 is also removed during the formation of the apertures 14, and such portion can be etched through during the etching of the conductive pads 24, during etching of the substrate 20, or as a separate etching step. Etching, laser drilling, mechanical milling, or other appropriate techniques can be used to remove the portion of the passivation layer 25.

In a particular embodiment, the process steps described above for forming the aperture 14 extending through the conductive pads 24, through the passivation layer 25, and into the silicon substrate 20 can be combined into a single process step. For example, when forming the apertures 14, a laser can be used to drill through the conductive pads 24, a portion of the passivation layer 25, and a portion of the substrate 20 in a single process step. This combination of process steps for creating the apertures 14 can be used in any of the embodiments described herein.

Other possible dielectric layer removal techniques include various selective etching techniques which can be isotropic or anisotropic in nature. Anisotropic etch processes include reactive ion etch processes in which a stream of ions are directed towards surfaces to be etched. Reactive ion etch processes are generally less selective than isotropic etch processes such that surfaces at which ions strike at high angles of incidence are etched to a greater extent than surfaces which are oriented with the stream of ions. When a reactive ion etch process is used, desirably, a mask layer is desirably deposited to overlie the passivation layer 25 and an aperture is formed therein which is aligned with the aperture 14. In such a way, the etch process avoids removing portions of the passivation layer 25 other than that which lies within the aperture 14.

Figure 2I:
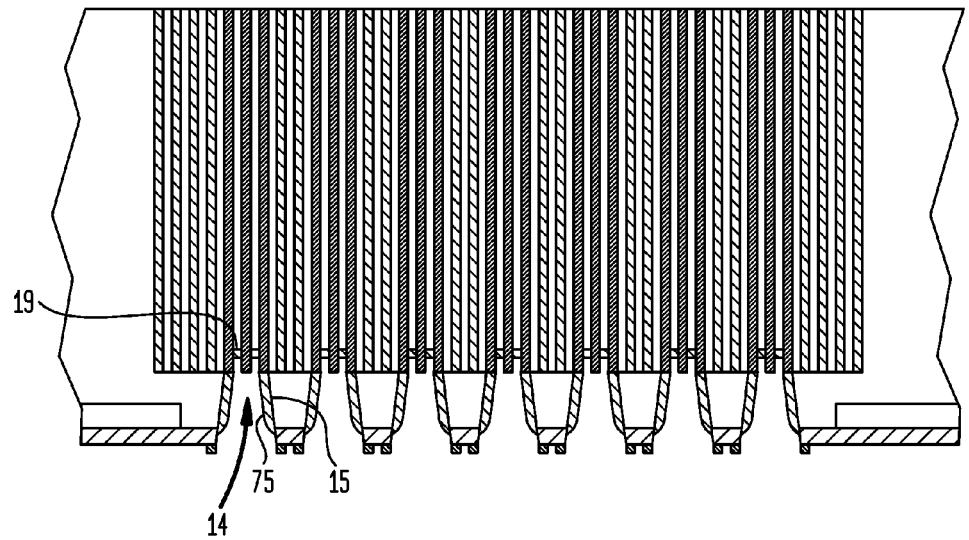

Thereafter, as illustrated in FIG. 2I, an insulating dielectric layer 75 can be formed extending within each of the apertures 14 and overlying the inner surface 15 of each aperture. In one example, such an insulating dielectric layer 75 can conformally coat the inner surface 15 exposed within the aperture 14. The insulating dielectric layers 75 can also conformally coat a downward-facing surface 19 of the aperture that extends between adjacent ones of the conductive interconnects 40. The insulating dielectric layer 75 can be formed using similar methods as those described above with respect to FIG. 2F.

Thereafter, referring again to FIG. 1A, the conductive vias 50 and the conductive contacts 60 of each TSV 30 can each be formed in contact with corresponding ones of the conductive interconnects 40. Each conductive via 50 can extend within the dielectric layer 75, within a corresponding aperture 14, and through a corresponding conductive pad 24 and can be electrically connected with such pad 24. Each conductive contact 60 can be formed in contact with each of the conductive interconnects 40 of its TSV 30 at a bottom surface 61 of the conductive contact. The conductive vias 50 and the conductive contacts 60 can be formed using similar methods as those described above with respect to forming the conductive interconnects 40 described in FIG. 2G.

Figure 3A:
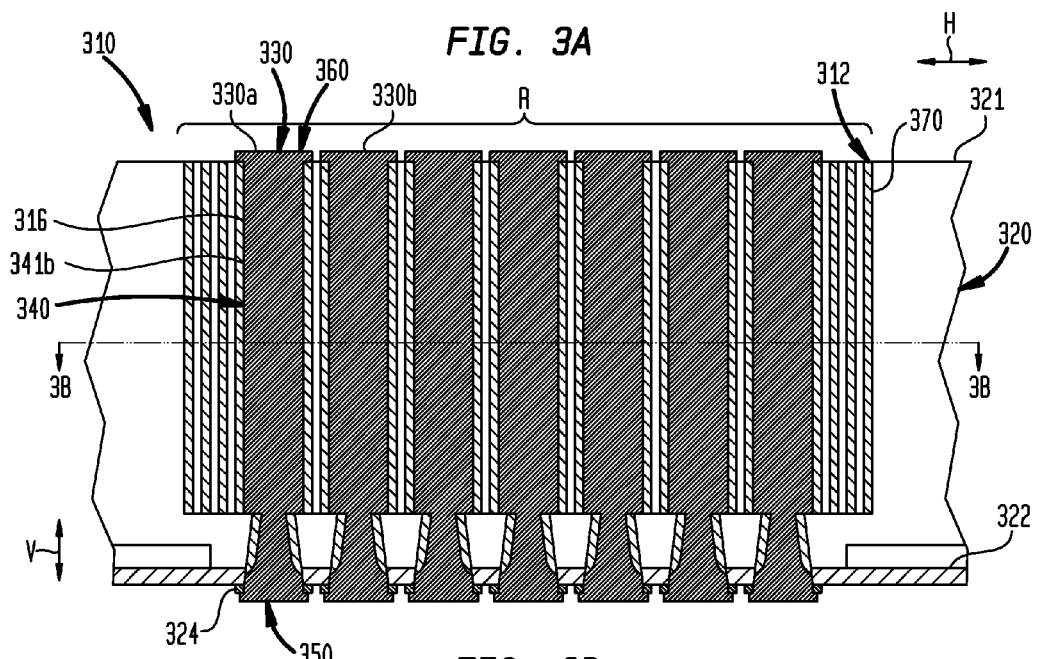
FIG. 3A is a side sectional view illustrating a via structure in accordance with another embodiment.
Figure 3B:
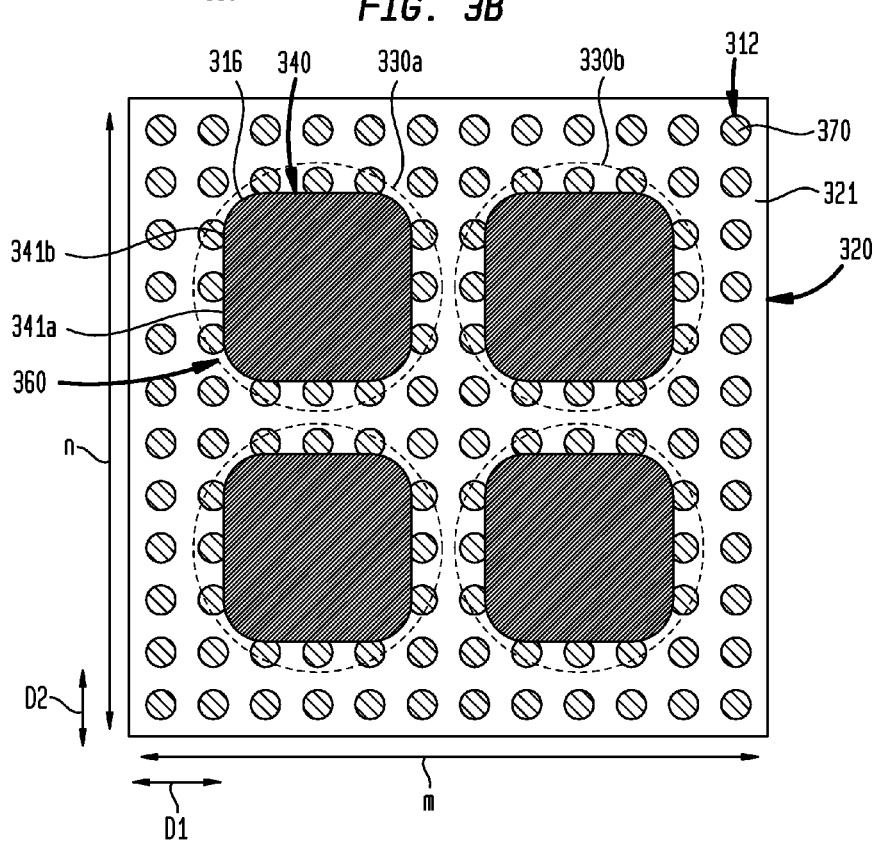
FIG. 3B is top sectional view of the microelectronic unit of FIG. 3A, taken along the line 3B-3B of FIG. 3A, showing a projection of the location of the conductive contacts in dotted lines.

FIGS. 3A and 3B illustrate a variation of the microelectronic unit of FIGS. 1A and 1B having an alternate configuration. The microelectronic unit 310 is the same as the microelectronic unit 10 described above, except that the microelectronic unit 310 includes TSVs 330 each having a single conductive interconnect 340 extending between a single conductive via 350 and a single conductive contact 360 rather than a plurality of conductive interconnects extending between a single common conductive via and a single common conductive contact. A method of fabricating the conductive interconnects 340 of the microelectronic unit 310 is described below, with reference to FIGS. 8A and 8B.

As shown in FIGS. 3A and 3B, the substrate 320 includes a porous silicon region R similar to that of the substrate 20 described above, and the substrate 320 includes a plurality of openings 312 extending from the rear surface 321 towards the front surface 322, the openings arranged in a symmetric or asymmetric distribution across an area of the rear surface, with at least m extending in a first direction D1 and n extending in a second direction D2 transverse thereto, each of m and n being greater than 1.

Each conductive interconnect 340 extends within a corresponding cavity 316 occupying an area in a horizontal plane substantially parallel to the rear surface 321 that is coextensive with a group of opening locations within the m×n distribution of openings that underlies the respective conductive contact 360 in the vertical direction V.

Each conductive interconnect 340 can be at least partially electrically isolated from an adjacent conductive interconnect by dielectric material 370 extending within openings 312 that are located between the conductive interconnects 340 of a first TSV 330a and a second TSV 330b, such that at least one of the openings containing the dielectric material can separate conductive interconnects from one another in the horizontal direction E.

In one embodiment, a vertically-extending portion 341a of each of the conductive interconnects 340 can directly contact material of the silicon substrate 320 adjacent thereto. In a particular embodiment, a vertically-extending portion 341b of one or more of the conductive interconnects 340 can directly contact the insulating dielectric material 370 of one or more openings 312 adjacent thereto. In such an embodiment, the vertically-extending portion 341b of one or more conductive interconnects 340 can extend partially into one or more openings 312 in the horizontal direction E.

Such embodiments in which each TSV includes a single thicker conductive interconnect 340 can provide such TSVs with a higher current-carrying capacity than TSV having a plurality of thinner conductive interconnects. In a particular example, a single substrate can include one or more TSVs 330 (FIG. 3A) each having a single conductive interconnect 340 and one or more TSVs 30 (FIG. 1A) each having a plurality of conductive interconnects 40.

Figure 4:
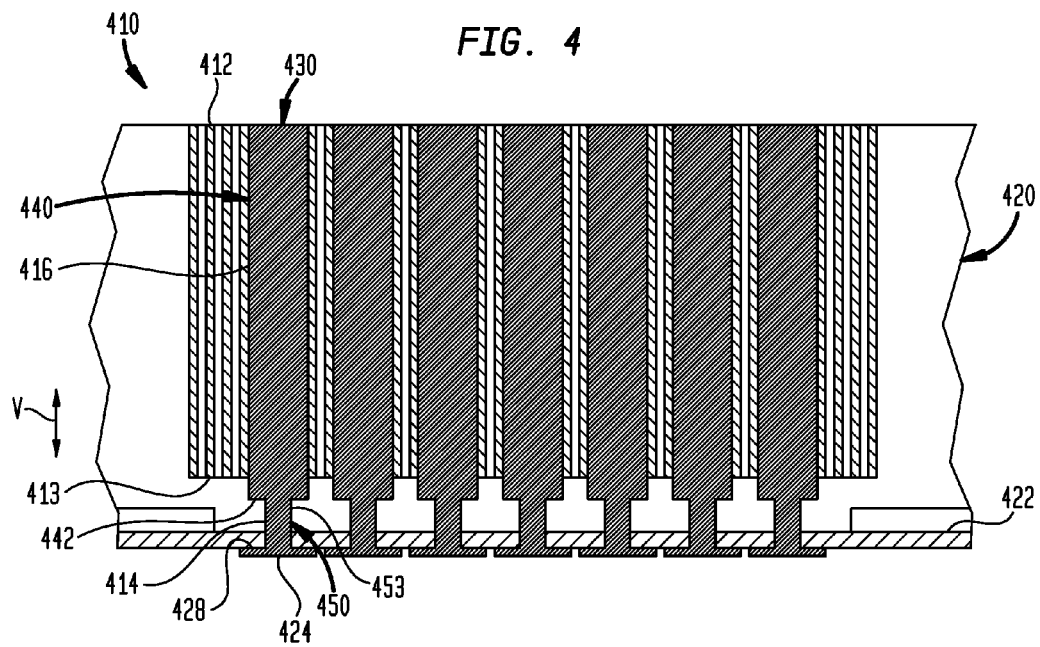
FIG. 4 is a sectional view illustrating a via structure in accordance with yet another embodiment.

FIG. 4 illustrates a variation of the microelectronic unit of FIGS. 3A and 3B having an alternate configuration. The microelectronic unit 410 is the same as the microelectronic unit 310 described above, except that the microelectronic unit 410 includes TSVs 430 each having a conductive via 450 that does not extend through the corresponding conductive pad 424.

In such an embodiment, each conductive via 450 can be formed in contact with the bottom surface 428 of the respective conductive pad 424 prior to forming the plurality of openings 412 (e.g., via-first processing). In one example, each aperture 414 can extend from two or more of the openings 412 to the bottom surface 428 of a respective one of the conductive pads 424. When the conductive interconnects 440 are formed within respective cavities 416 extending through the silicon substrate 420, each conductive interconnect can be formed in contact with an upper portion 453 of a corresponding conductive via 450. In a particular example, a bottom surface 442 of each of the conductive interconnects 440 can extend below the location in a vertical direction V of the substrate 420 (i.e., closer to the front surface 422) of a bottom surface 413 of each of the openings 412.

Figure 5:
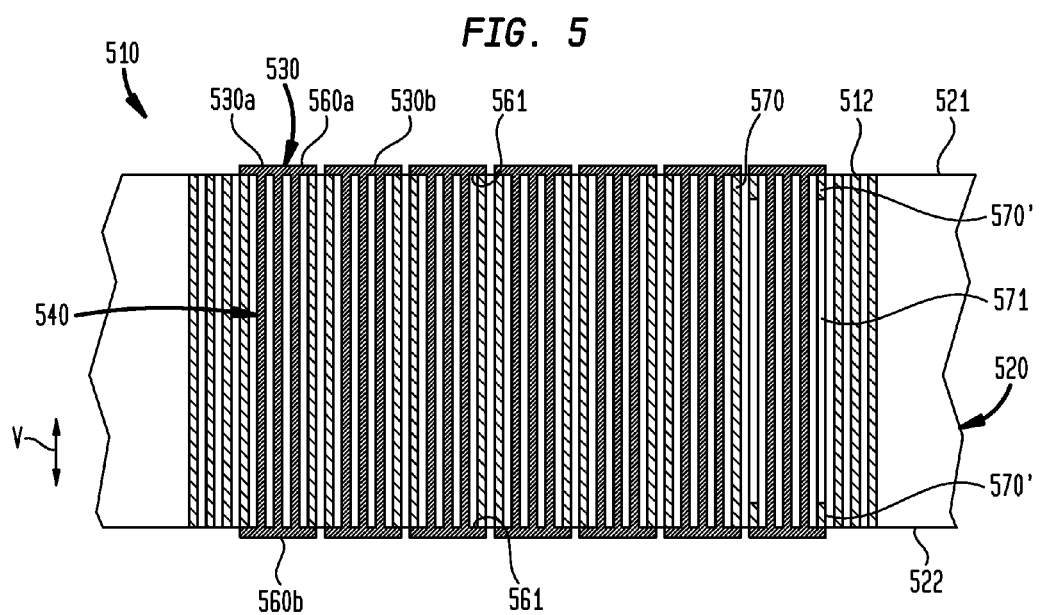
FIG. 5 is a sectional view illustrating a via structure in accordance with still another embodiment.

FIG. 5 illustrates a variation of the microelectronic unit of FIGS. 1A and 1B having an alternate configuration. The interconnection substrate 510 is the same as the microelectronic unit 10 described above, except that the interconnection substrate 510 does not include a plurality of active semiconductor devices (e.g., transistors, diodes, etc.) can be disposed in an active semiconductor region thereof or conductive vias, and each TSV 530 includes conductive contacts 560a and 560b exposed at each surface of the silicon substrate 520 and electrically connected with a respective plurality of conductive interconnects 540.

In a particular embodiment, the substrate 520 can have an effective CTE less than 8 ppm/° C. In one example, the substrate 520 can consist essentially of semiconductor material. In other examples, the substrate 520 can consist essentially of glass or ceramic material.

In the embodiment shown in FIG. 5, each conductive interconnect 540 extends between a first conductive contact 560a exposed at the first surface 521 of the silicon substrate 520 and a second conductive contact 560b exposed at the second surface 522. In one example, the first and second conductive contacts 560a, 560b can be aligned in a vertical direction V substantially perpendicular to the first surface 521 with the corresponding plurality of conductive interconnects 540 of the corresponding TSV 530.

In a particular embodiment, some of the openings 512 that are located around the conductive interconnects 540 of a particular TSV 530 can be only partially filled with an insulating dielectric material 570', such that a void 571 is located between two separated portions of the dielectric material 570' located adjacent the first and second surfaces 521, 522 of the substrate 520.

Figure 6E:
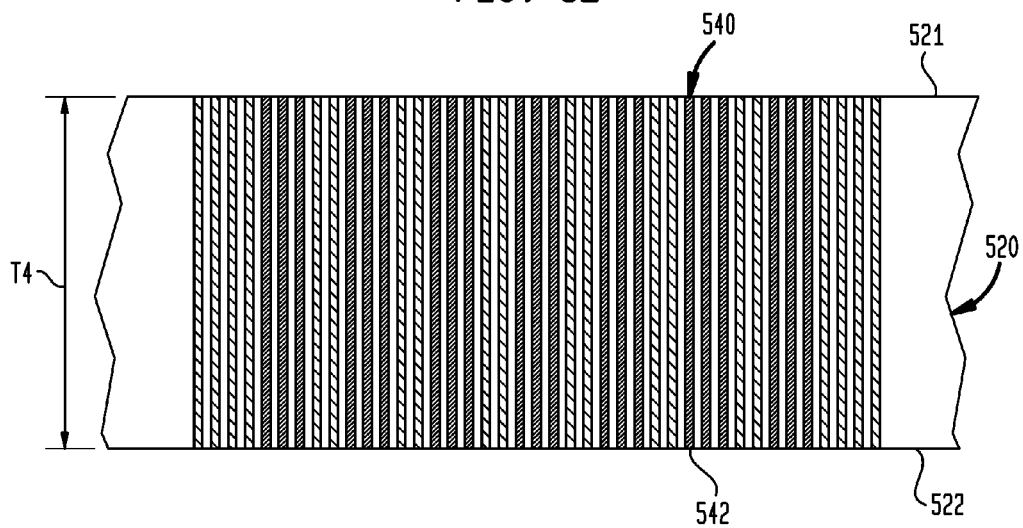

A method of fabricating the microelectronic unit 510 (FIG. 5) will now be described, with reference to FIGS. 6A-6E. As illustrated in FIG. 6A, material can be removed from the first or rear surface 521 of the substrate 520 to form a plurality of openings 512 extending from the first surface towards the second or front surface 522. Such openings 512 can be the same as the openings 12 described above with reference to FIGS. 1A, 1B, and 2C. In a particular example, the openings 512 can be arranged in m×n array (such as in FIGS. 1B and 2D), each of m and n being greater than 1, each opening extending in the vertical direction V. In one embodiment, the plurality of openings 512 can be arranged in a symmetric or asymmetric distribution across an area of the first surface 521, with at least m extending in a first direction D1 and n extending in a second direction D2 transverse thereto (such as in FIG. 1B), each of m and n being greater than 1.

Similar to the openings 12 shown in FIG. 1A, the openings 512 can be a plurality of pores that are formed by anisotropic etching, such that a region R of porous silicon is produced extending from the first surface 521 of the substrate 520. Such openings 512 can be can be formed using the same methods as those described above with respect to FIG. 2C.

Thereafter, as illustrated in FIG. 6B, a mask layer 517 can be deposited overlying particular openings 512 or groups of openings 512 at the first surface 521 of the substrate 520 where it is desired to prevent the deposit of metal when forming the conductive interconnects 540 (FIG. 6D). The mask layer 517 can be the same as the mask layer 17 described above with reference to FIG. 2E.

Thereafter, as illustrated in FIG. 6C, an insulating dielectric material 570 can be formed extending within the openings 512 that are not covered by the mask layer 517. Such a dielectric material 570 can extend within at least some of the openings 512 that are located between the openings 512 that will later include a plurality of first conductive interconnects 540 of a first TSV 530a and a plurality of second conductive interconnects 540 of a second TSV 530b, such that at least one of the openings containing the insulating dielectric material 570 can separate the plurality of first conductive interconnects from the plurality of second conductive interconnects in the horizontal direction E. The insulating dielectric material 570 can be formed within the openings 512 using the same methods as those described above with respect to FIG. 2F.

Thereafter, as illustrated in FIG. 6D, the mask layer 517 can be removed from the first surface 521, and the plurality of conductive interconnects 540 can be formed extending within the openings 512 that remain unoccupied after formation of the dielectric material 570 in some of the openings. The conductive interconnects 540 can overlie the inner surfaces 511 of the openings 512. The conductive interconnects 540 can be formed within the openings 512 using the same methods as those described above with respect to FIG. 2G.

Thereafter, as illustrated in FIG. 6E, the thickness of the substrate 520 between the first surface 521 and an initial second surface 522' (FIG. 6D) can be reduced, thereby exposing a final second surface 522. Material of the substrate 520 can be removed until the bottom surfaces 513 (FIG. 6D) of each opening 512 are removed, thereby exposing a lower surface 542 of each of the conductive interconnects 540 at the final second surface 522.

Grinding, lapping, or polishing of the initial second surface 522' or a combination thereof can be used to reduce the thickness of the substrate 520. During this step, as an example, the initial thickness T3 (shown in FIG. 6D) of the substrate 520 can be reduced from about 700 μm to a thickness T4 (shown in FIG. 6E) of about 130 μm or less.

Thereafter, referring again to FIG. 5, the conductive contacts 560a and 560b of each TSV 530 can each be formed at the respective first and second surfaces 521, 522 of the substrate 520 in contact with corresponding ones of the conductive interconnects 540. Each conductive contact 560a and 560b can be formed in contact with each of the conductive interconnects 540 of its TSV 530 at a bottom surface 561 of the conductive contact. The conductive contacts 60 can be formed using similar methods as those described above with respect to forming the conductive interconnects 540 described in FIG. 2G.

Figure 7:
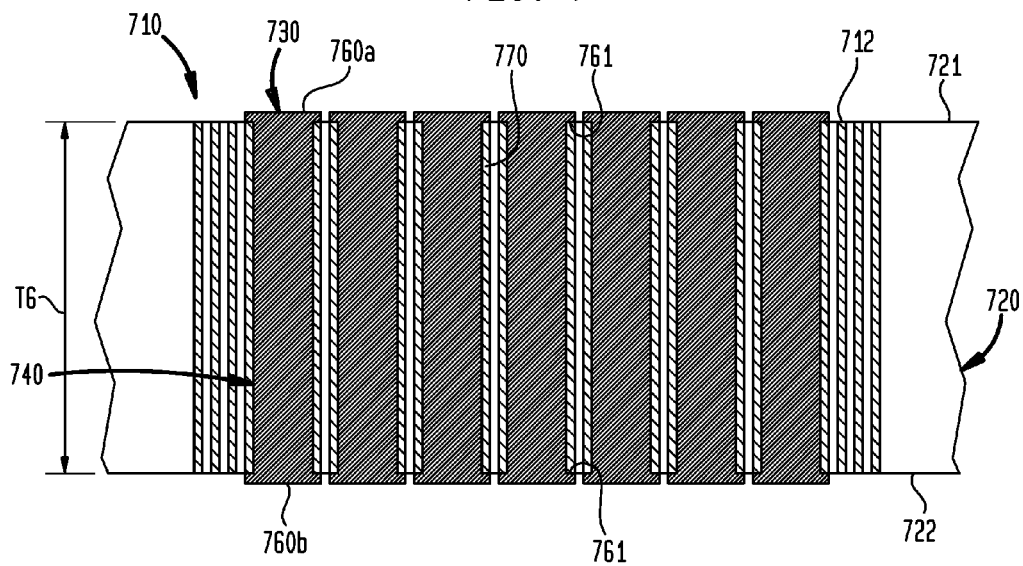
FIG. 7 is a sectional view illustrating a via structure in accordance with another embodiment.

FIG. 7 illustrate a variation of the microelectronic unit of FIGS. 1A and 1B having an alternate configuration. The microelectronic unit 710 is the same as the microelectronic unit 510 described above, except that the microelectronic unit 710 includes TSVs 730 each having a single conductive interconnect 740 extending between conductive contacts 760a and 760b exposed at the respective first and second surface 721, 722 of the substrate 720 rather than a plurality of conductive interconnects extending between common conductive contacts exposed at the first and second surfaces.

Such embodiments in which each TSV includes a single thicker conductive interconnect 740 can provide such TSVs with a higher current-carrying capacity than TSV having a plurality of thinner conductive interconnects. In a particular example, a single substrate can include one or more TSVs 730 (FIG. 7) each having a single conductive interconnect 740 and one or more TSVs 530 (FIG. 5) each having a plurality of conductive interconnects 540.

A method of fabricating the conductive interconnects 740 of the microelectronic unit 710 (FIG. 7) will now be described, with reference to FIGS. 8A and 8B. The method of fabricating the conductive interconnects 740 can begin with the steps described above with reference to the microelectronic unit 510 shown in FIGS. 6A-6C. Thereafter, as illustrated in FIG. 8A, the mask layer 517 (FIG. 6C) can be removed from the rear surface 721, and cavities 716 can be formed extending from the first surface 721 partially through the silicon substrate 720 towards the initial second surface 722'.

The cavities 716 can be similar to the cavities 316 described above with respect to FIGS. 3A and 3B, such that each cavity can occupy an area in a horizontal plane substantially parallel to the rear surface 721 that is coextensive with a group of opening locations within the m×n distribution of openings 712.

The cavities 716 can be formed for example, by selectively etching the silicon substrate 720, after forming a mask layer where it is desired to preserve remaining portions of the first surface 721 of the substrate. For example, a photoimageable layer, e.g., a photoresist layer, can be deposited and patterned to cover only portions of the first surface 721, after which a timed etch process can be conducted to form the cavities 716.

Each cavity 716 can have an inner surface 706 extending in a vertical direction V that is substantially perpendicular to the first surface 721 and a lower surface 708 extending in a horizontal direction E that is substantially parallel to the first surface. Such lower surfaces 708 can be approximately coextensive with the bottom surfaces 713 of the group of opening locations within the m×n distribution of openings where the cavity 716 is located.

The inner surface 706 of each cavity 716 can extend in a vertical or substantially vertical direction V downwardly from the first surface 721 substantially at right angles to the first surface. Anisotropic etching processes, laser dicing, laser drilling, mechanical removal processes, e.g., sawing, milling, ultrasonic machining, among others, can be used to form first cavities 716 having essentially vertical inner surfaces 706.

In a particular embodiment (not shown), after the cavities 716 are formed, an insulating dielectric layer (not shown) can be deposited overlying the inner surfaces 706 of the cavities, such that the conductive interconnects 740 will extend within such an insulating dielectric layer when they are deposited within the openings (FIG. 8B).

Thereafter, as illustrated in FIG. 8B, the conductive interconnects 740 can be formed extending within respective ones of the cavities 716. The conductive interconnects 740 can overlie the inner surfaces 706 and the lower surface 708 of the cavities 716. The conductive interconnects 740 can be formed using similar methods as those described above with respect the conductive interconnects 40 shown in FIG. 2G.

The conductive interconnects 740 can be similar to the conductive interconnects 340 described above with respect to FIGS. 3A and 3B, such that each conductive interconnect 740 can occupy an area in a horizontal plane substantially parallel to the rear surface 721 that is coextensive with a group of opening locations within the m×n distribution of openings 712. Also, each conductive interconnect 740 can be at least partially electrically isolated from an adjacent conductive interconnect by dielectric material 770 extending within openings 712 that are located between the adjacent conductive interconnects 740.

Thereafter, referring again to FIG. 7, the thickness of the substrate 720 between the first surface 721 and the initial second surface 722' (FIG. 8B) can be reduced, thereby exposing a final second surface 722. Material of the substrate 720 can be removed until the bottom surfaces 713 (FIG. 6D) of each opening 712 and the bottom surfaces 708 of each cavity 706 are removed, thereby exposing a lower surface 742 of each of the conductive interconnects 740 at the final second surface 722. Grinding, lapping, or polishing of the initial second surface 722' or a combination thereof can be used to reduce the thickness of the substrate 720. During this step, as an example, the initial thickness T5 (shown in FIG. 8B) of the substrate 720 can be reduced from about 700 μm to a thickness T6 (shown in FIG. 7) of about 130 μm or less.

Thereafter, the conductive contacts 760a and 760b of each TSV 730 can each be formed at the respective first and second surfaces 721, 722 of the substrate 720 in contact with corresponding ones of the conductive interconnects 740. Each conductive contact 760a and 760b can be formed in contact with the corresponding conductive interconnect 740 of its TSV 730 at a bottom surface 761 of the conductive contact. The conductive contacts 760a and 760b can be formed using the same methods as those described above with respect to forming the conductive interconnects 40 shown in FIG. 2G.

Figure 9:
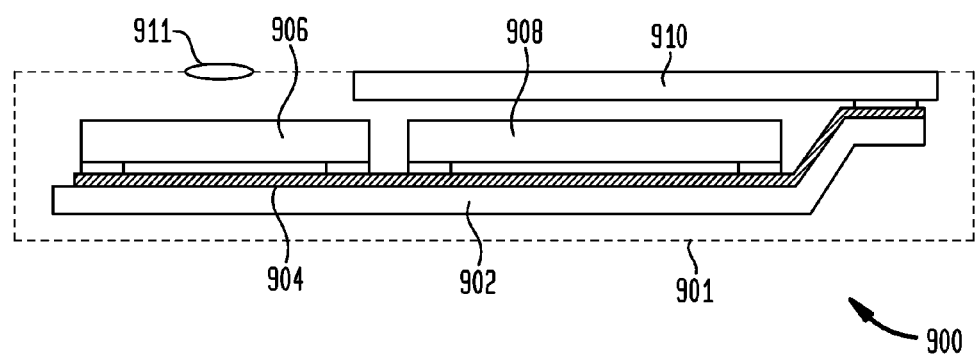
FIG. 9 is a schematic depiction of a system according to one embodiment of the invention.

The microelectronic units described above can be utilized in construction of diverse electronic systems, as shown in FIG. 9. For example, a system 900 in accordance with a further embodiment of the invention includes a microelectronic assembly 906 as described above in conjunction with other electronic components 908 and 910. In the example depicted, component 908 is a semiconductor chip whereas component 910 is a display screen, but any other components can be used. Of course, although only two additional components are depicted in FIG. 9 for clarity of illustration, the system may include any number of such components. The microelectronic assembly 906 may be any of the microelectronic units described above. In a further variant, any number of such microelectronic assemblies 906 can be used.

The microelectronic assembly 906 and components 908 and 910 can be mounted in a common housing 901, schematically depicted in broken lines, and can be electrically interconnected with one another as necessary to form the desired circuit. In the exemplary system shown, the system can include a circuit panel 902 such as a flexible printed circuit board, and the circuit panel can include numerous conductors 904, of which only one is depicted in FIG. 9, interconnecting the components with one another. However, this is merely exemplary; any suitable structure for making electrical connections can be used.

The housing 901 is depicted as a portable housing of the type usable, for example, in a cellular telephone or personal digital assistant, and screen 910 can be exposed at the surface of the housing. Where structure 906 includes a light-sensitive element such as an imaging chip, a lens 911 or other optical device also can be provided for routing light to the structure. Again, the simplified system shown in FIG. 9 is merely exemplary; other systems, including systems commonly regarded as fixed structures, such as desktop computers, routers and the like can be made using the structures discussed above.

The cavities, apertures, and conductive elements disclosed herein can be formed by processes such as those disclosed in greater detail in the co-pending, commonly assigned U.S. patent application Ser. Nos. 12/842,587, 12/842,612, 12/842,651, 12/842,669, 12/842,692, and 12/842,717, filed Jul. 23, 2010, and in published U.S. Patent Application Publication No. 2008/0246136, the disclosures of which are incorporated by reference herein.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

It will be appreciated that the various dependent claims and the features set forth therein can be combined in different ways than presented in the initial claims. It will also be appreciated that the features described in connection with individual embodiments may be shared with others of the described embodiments.

The invention claimed is:

1. A microelectronic unit, comprising:
a semiconductor substrate having a front surface and a rear surface remote therefrom and embodying a plurality of active semiconductor devices therein, the substrate having a plurality of conductive pads exposed at the front surface and a plurality of openings arranged in a symmetric or asymmetric distribution across an area of the rear surface, with at least m openings spaced apart in a first direction along the rear surface and n openings spaced apart in a second direction along the rear surface transverse to the first direction, each of m and n being greater than 1;
first and second conductive vias electrically connected with respective first and second pads of the plurality of conductive pads;
pluralities of first and second conductive interconnects extending within respective first and second subsets of the openings, each first conductive interconnect connected to the first conductive via, each second conductive interconnect connected to the second conductive via, the pluralities of first and second conductive interconnects being made of metal; and
first and second conductive contacts exposed at the rear surface for interconnection with an external element, the first and second conductive contacts being electrically connected to the first and second conductive interconnects, respectively, the first and second subsets of the openings underlying the respective first and second conductive contacts, at least one of the openings of the first or second subset having a void located therein and being devoid of the first and second conductive interconnects,
wherein the plurality of first conductive interconnects is separated from the plurality of second conductive interconnects in a horizontal direction substantially parallel to the front surface by at least one of the plurality of openings, the at least one opening at least partially filled with an insulating dielectric material.

2. A microelectronic unit as claimed in claim 1, wherein each conductive interconnect includes a portion extending in a vertical direction substantially perpendicular to the front surface, the plurality of first conductive interconnects being separated from one another in the horizontal direction by material of the semiconductor substrate.

3. A microelectronic unit as claimed in claim 1, wherein each conductive interconnect has a width in the horizontal direction of 5 microns or less.

4. A microelectronic unit as claimed in claim 1, wherein each conductive via has a frusto-conical shape.

5. A microelectronic unit as claimed in claim 1, wherein the first and second conductive contacts are aligned in a vertical direction substantially perpendicular to the front surface with the respective pluralities of first and second conductive interconnects.

6. A microelectronic unit as claimed in claim 1, wherein each pad has a top surface exposed at the front surface and a bottom surface remote from the top surface, and the first and second conductive vias extend through the respective first and second pads from the bottom surface to the top surface thereof.

7. A microelectronic unit as claimed in claim 1, wherein the first and second conductive vias does not extend through the respective first and second pads.

8. A microelectronic unit as claimed in claim 1, further comprising at least one aperture, each aperture extending from two or more of the openings to at least a bottom surface of a respective one of the pads, wherein the first and second conductive vias extends within respective first and second apertures of the at least one aperture.

9. A microelectronic unit as claimed in claim 1, wherein the first and second conductive vias include doped semiconductor material.

10. A microelectronic unit as claimed in claim 1, wherein the first and second conductive vias are directly connected to the first and second pads, respectively.

11. A microelectronic unit as claimed in claim 1, wherein the first and second conductive vias are electrically connected with the respective first and second pads through intermediate conductive structure extending therebetween.

12. A system comprising a structure according to claim 1 and one or more other electronic components electrically connected to the structure.

13. A system as claimed in claim 12, further comprising a housing, said structure and said other electronic components being mounted to said housing.

14. A microelectronic unit, comprising:
a semiconductor substrate having a front surface and a rear surface remote therefrom and embodying a plurality of active semiconductor devices therein, the substrate having a plurality of conductive pads exposed at the front surface and a plurality of openings arranged in a symmetric or asymmetric distribution across an area of the rear surface, with at least m openings spaced apart in a first direction along the rear surface and n openings spaced apart in a second direction along the rear surface transverse to the first direction, each of m and n being greater than 1;
first and second conductive vias electrically connected with respective first and second pads of the plurality of conductive pads;
pluralities of first and second conductive interconnects extending within respective first and second subsets of the openings, each first conductive interconnect connected to the first conductive via, each second conductive interconnect connected to the second conductive via, the pluralities of first and second conductive interconnects being made of metal; and first and second conductive contacts exposed at the rear surface for interconnection with an external element, the first and second conductive contacts being electrically connected to the first and second conductive interconnects, respectively, the first and second subsets of the openings underlying the respective first and second conductive contacts, at least one of the openings of the first or second subset having a void located therein, the at least one of the openings having the void located therein being partially filled with an insulating dielectric material, wherein the plurality of first conductive interconnects is separated from the plurality of second conductive interconnects in a horizontal direction substantially parallel to the front surface by at least one of the plurality of openings, the at least one opening at least partially filled with an insulating dielectric material.

15. A microelectronic unit as claimed in claim 14, wherein the void is located between the dielectric material and a bottom surface of the at least one of the openings, the bottom surface being remote from the rear surface.

16. A microelectronic unit as claimed in claim 14, wherein each conductive interconnect includes a portion extending in a vertical direction substantially perpendicular to the front surface, the plurality of first conductive interconnects being separated from one another in the horizontal direction by material of the semiconductor substrate.

17. A microelectronic unit as claimed in claim 14, wherein each conductive interconnect has a width in the horizontal direction of 5 microns or less.

18. A microelectronic unit as claimed in claim 14, wherein each conductive via has a frusto-conical shape.

19. A microelectronic unit as claimed in claim 14, wherein the first and second conductive contacts are aligned in a vertical direction substantially perpendicular to the front surface with the respective pluralities of first and second conductive interconnects.

20. A microelectronic unit as claimed in claim 14, wherein each pad has a top surface exposed at the front surface and a bottom surface remote from the top surface, and the first and second conductive vias extend through the respective first and second pads from the bottom surface to the top surface thereof.

21. A microelectronic unit as claimed in claim 14, further comprising at least one aperture, each aperture extending from two or more of the openings to at least a bottom surface of a respective one of the pads, wherein the first and second conductive vias extends within respective first and second apertures of the at least one aperture.

22. A microelectronic unit as claimed in claim 14, wherein the first and second conductive vias include doped semiconductor material.

23. A microelectronic unit as claimed in claim 14, wherein the first and second conductive vias are directly connected to the first and second pads, respectively.

24. A microelectronic unit as claimed in claim 14, wherein the first and second conductive vias are electrically connected with the respective first and second pads through intermediate conductive structure extending therebetween.

25. A system comprising a structure according to claim 14 and one or more other electronic components electrically connected to the structure.

26. A system as claimed in claim 25, further comprising a housing, said structure and said other electronic components being mounted to said housing.

27. A microelectronic unit, comprising:
a semiconductor substrate having a front surface and a rear surface remote therefrom and embodying a plurality of active semiconductor devices therein, the substrate having a plurality of conductive pads exposed at the front surface and a plurality of openings arranged in a symmetric or asymmetric distribution across an area of the rear surface, with at least m openings spaced apart in a first direction along the rear surface and n openings spaced apart in a second direction along the rear surface transverse to the first direction, each of m and n being greater than 1;

first and second conductive vias electrically connected with respective first and second pads of the plurality of conductive pads;

pluralities of first and second conductive interconnects extending within respective ones of the openings, each first conductive interconnect connected to the first conductive via, each second conductive interconnect connected to the second conductive via, the plurality of first conductive interconnects extending within at least two of the openings spaced apart in the first direction and within at least two of the openings spaced apart in the second direction, the plurality of second conductive interconnects extending within at least two of the openings spaced apart in the first direction and within at least two of the openings spaced apart in the second direction, the pluralities of first and second conductive interconnects being made of metal and having portions directly contacting semiconductor material of the substrate; and first and second conductive contacts exposed at the rear surface for interconnection with an external element, the first and second conductive contacts being electrically connected to the first and second conductive interconnects, respectively, wherein the plurality of first conductive interconnects is separated from the plurality of second conductive interconnects in a horizontal direction substantially parallel to the front surface by at least one of the plurality of openings, the at least one opening at least partially filled with an insulating dielectric material.

28. A microelectronic unit as claimed in claim 27, wherein the plurality of first conductive interconnects extends within adjacent ones of the at least two of the openings spaced apart in the first direction and within adjacent ones of the at least two of the openings spaced apart in the second direction, and wherein the plurality of second conductive interconnects extends within adjacent ones of the at least two of the openings spaced apart in the first direction and within adjacent ones of the at least two of the openings spaced apart in the second direction.

29. A microelectronic unit as claimed in claim 27, wherein each conductive interconnect includes a portion extending in a vertical direction substantially perpendicular to the front surface, the plurality of first conductive interconnects being separated from one another in the horizontal direction by material of the semiconductor substrate.

30. A microelectronic unit as claimed in claim 27, wherein each conductive interconnect has a width in the horizontal direction of 5 microns or less.

31. A microelectronic unit as claimed in claim 27, wherein each conductive via has a frusto-conical shape.

32. A microelectronic unit as claimed in claim 27, wherein the first and second conductive contacts are aligned in a vertical direction substantially perpendicular to the front surface with the respective pluralities of first and second conductive interconnects.

33. A microelectronic unit as claimed in claim 27, wherein each pad has a top surface exposed at the front surface and a bottom surface remote from the top surface, and the first and second conductive vias extend through the respective first and second pads from the bottom surface to the top surface thereof.

34. A microelectronic unit as claimed in claim 27, further comprising at least one aperture, each aperture extending from two or more of the openings to at least a bottom surface of a respective one of the pads, wherein the first and second conductive vias extends within respective first and second apertures of the at least one aperture.

35. A microelectronic unit as claimed in claim 27, wherein the first and second conductive vias include doped semiconductor material.

36. A microelectronic unit as claimed in claim 27, wherein the first and second conductive vias are directly connected to the first and second pads, respectively.

37. A microelectronic unit as claimed in claim 27, wherein the first and second conductive vias are electrically connected with the respective first and second pads through intermediate conductive structure extending therebetween.

38. A system comprising a structure according to claim 27 and one or more other electronic components electrically connected to the structure.

39. A system as claimed in claim 38, further comprising a housing, said structure and said other electronic components being mounted to said housing.

40. A microelectronic unit as claimed in claim 27, wherein the plurality of openings arranged in a symmetric or asymmetric distribution are arranged in more than one array across the area of the rear surface, with at least m1 openings spaced apart in the first direction along the rear surface and n1 openings spaced apart in the second direction along the rear surface in a first region of the substrate, and with at least m2 openings spaced apart in the first direction along the rear surface and n2 openings spaced apart in the second direction along the rear surface in a second region of the substrate, each of m1, m2, n1, and n2 being greater than 1, where m1 is different than m2 and n1 is different than n2.

* * * * *